(12) United States Patent
Kojima et al.

(10) Patent No.: US 7,795,961 B2
(45) Date of Patent: Sep. 14, 2010

(54) OFFSET CANCELLATION CIRCUIT AND DISPLAY DEVICE

(75) Inventors: Tomokazu Kojima, Osaka (JP); Makoto Mizuki, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/435,880

(22) Filed: May 5, 2009

(65) Prior Publication Data

US 2009/0289703 A1 Nov. 26, 2009

(30) Foreign Application Priority Data

May 21, 2008 (JP) .............................. 2008-133150

(51) Int. Cl.
*H03F 1/02* (2006.01)
(52) U.S. Cl. .............................. 330/9; 330/255; 330/51
(58) Field of Classification Search .................... 330/9, 330/51, 257, 261, 255
See application file for complete search history.

(56) References Cited

U.S. PATENT DOCUMENTS

| 6,448,836 | B2 | 9/2002 | Kokubun et al. | |
|---|---|---|---|---|
| 6,586,990 | B2* | 7/2003 | Udo et al. | 330/9 |
| 6,911,858 | B2* | 6/2005 | Mori | 327/307 |
| 6,946,905 | B2* | 9/2005 | Kokubun et al. | 330/9 |
| 7,339,422 | B2* | 3/2008 | Tsuchi | 330/9 |

FOREIGN PATENT DOCUMENTS

| JP | 2004-350256 | 12/2004 |
|---|---|---|
| JP | 2005-117547 | 4/2005 |

OTHER PUBLICATIONS

David A. Johs et al., "Analog Integrated Circuit Design," pp. 105-118, pp. 229-231, John Willy & Sons, Inc., 1997.

* cited by examiner

*Primary Examiner*—Henry K Choe
(74) *Attorney, Agent, or Firm*—McDermott Will & Emery LLP

(57) ABSTRACT

In an offset cancellation circuit according to the present invention, a first capacitance is connected to a gate of a first transistor of a first active load, and a second capacitance is connected to a gate of a second transistor of the first active load. A switch sets a first time period and a second time period in connection states between the first and second transistors and the first and second capacitances. The connection states between the first and second transistors and the first and second capacitances are set so that a gate voltage of the first transistor is supplied to the first capacitance, and a gate voltage of the second transistor is supplied to the second capacitance during the first time period; and so that the first and second capacitances can retain charges, and the second time period becomes an output time period of the operational amplifier during the second time period.

4 Claims, 15 Drawing Sheets

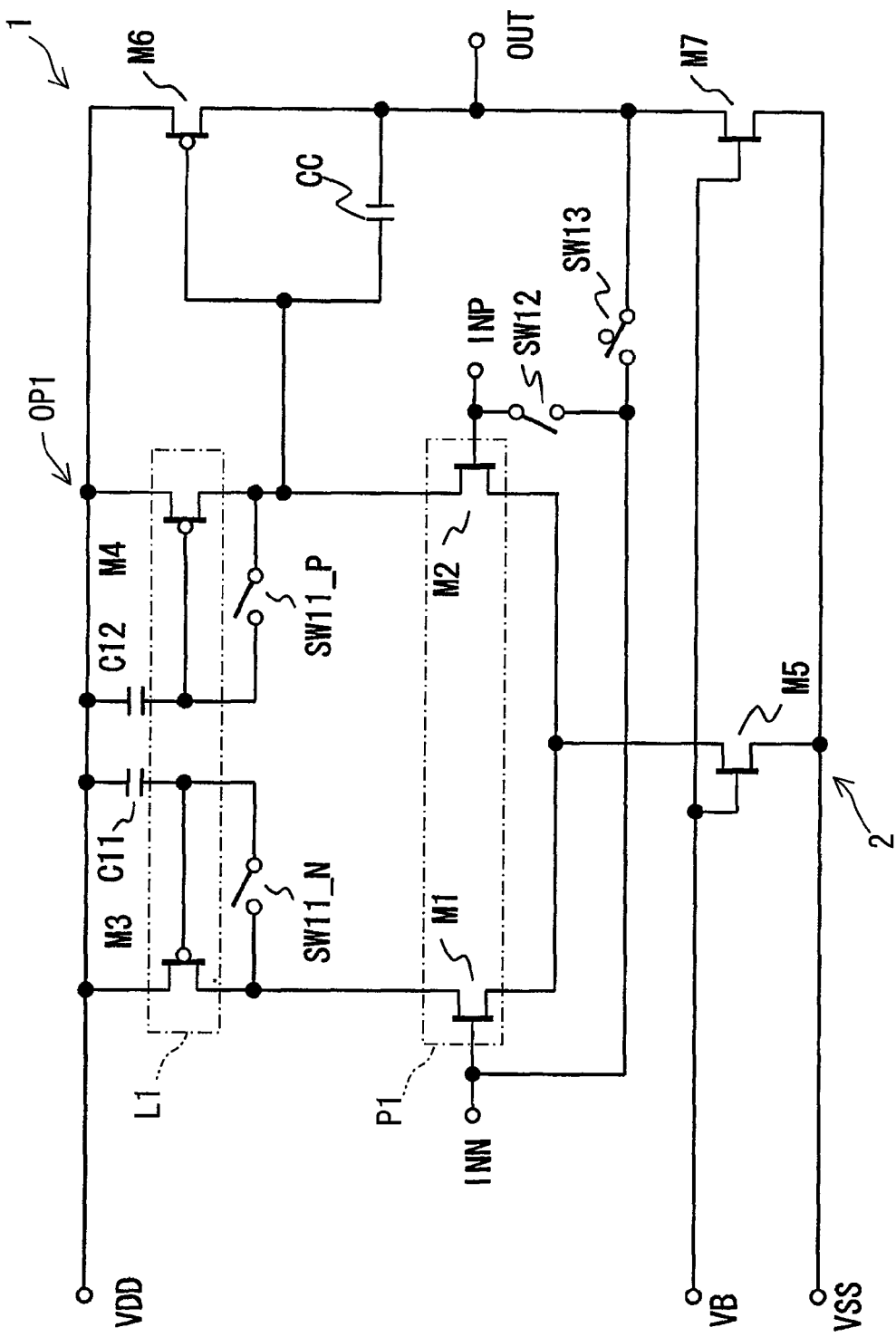
F I G. 1

F I G. 4
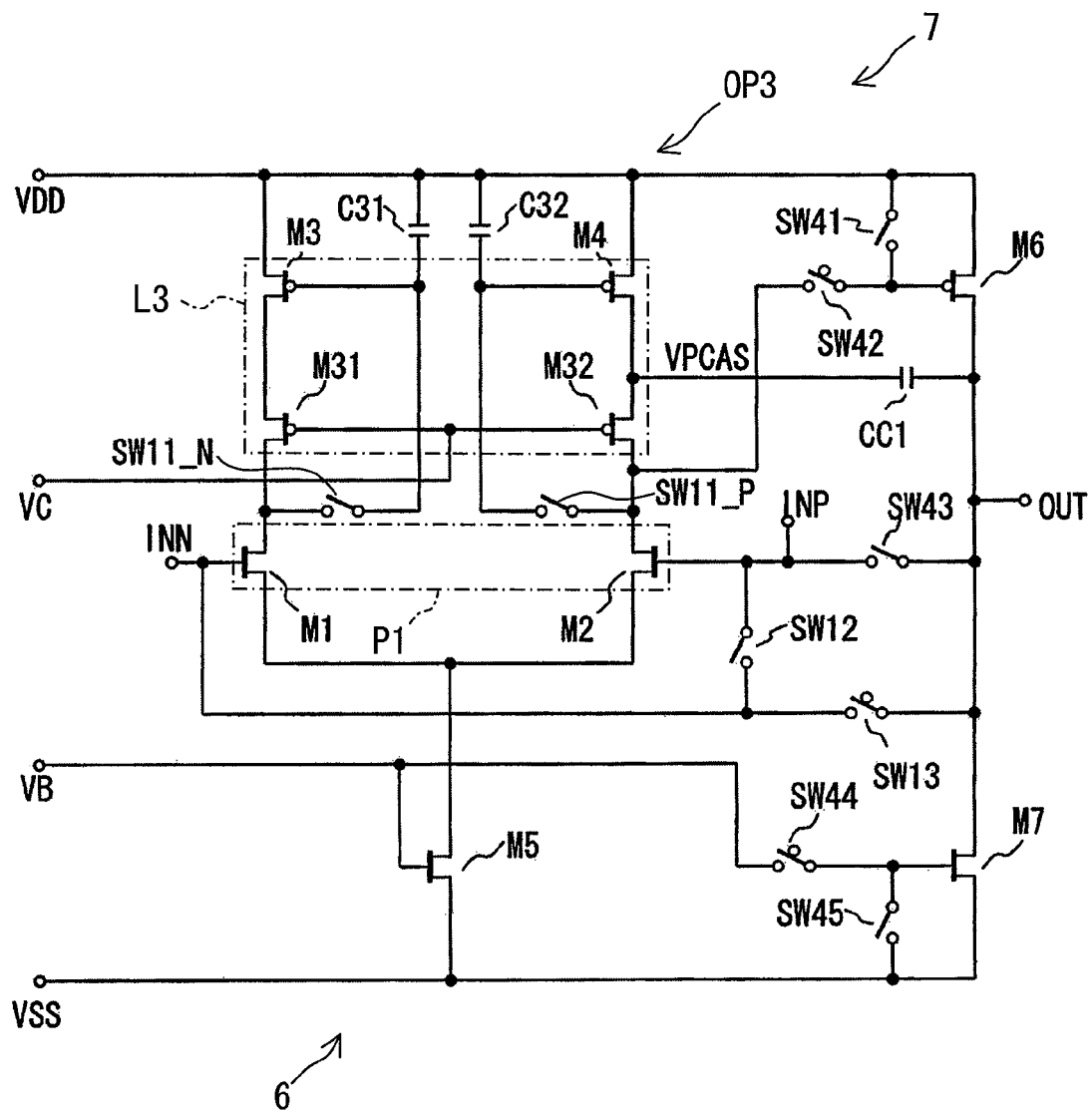

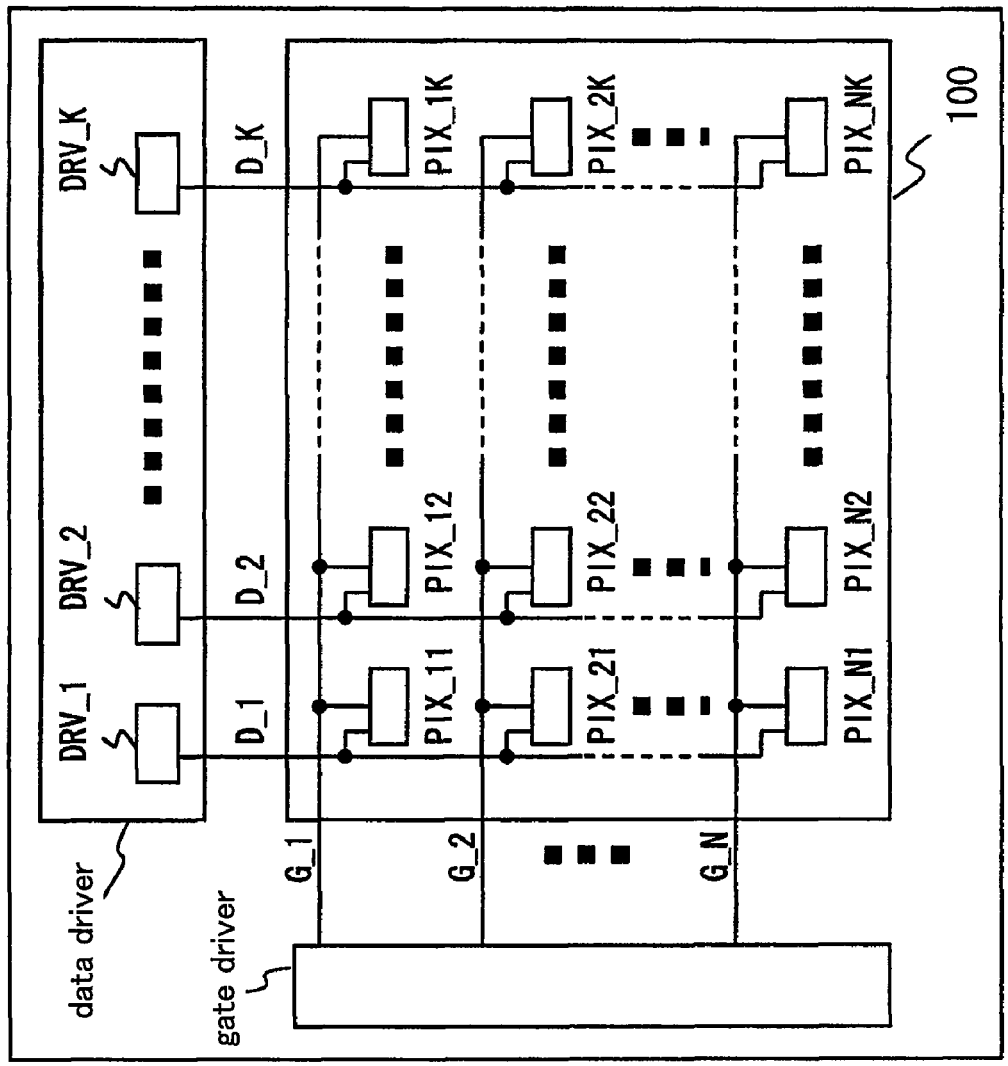

F I G. 1 2 A
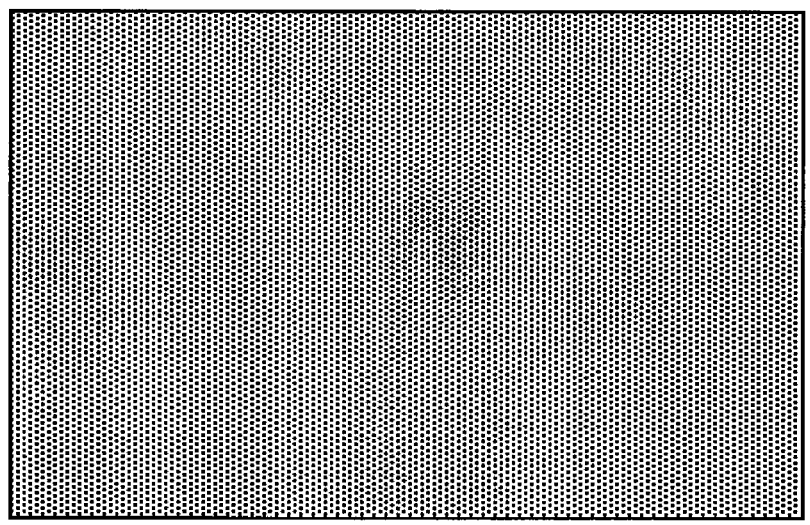
F I G. 1 2 B
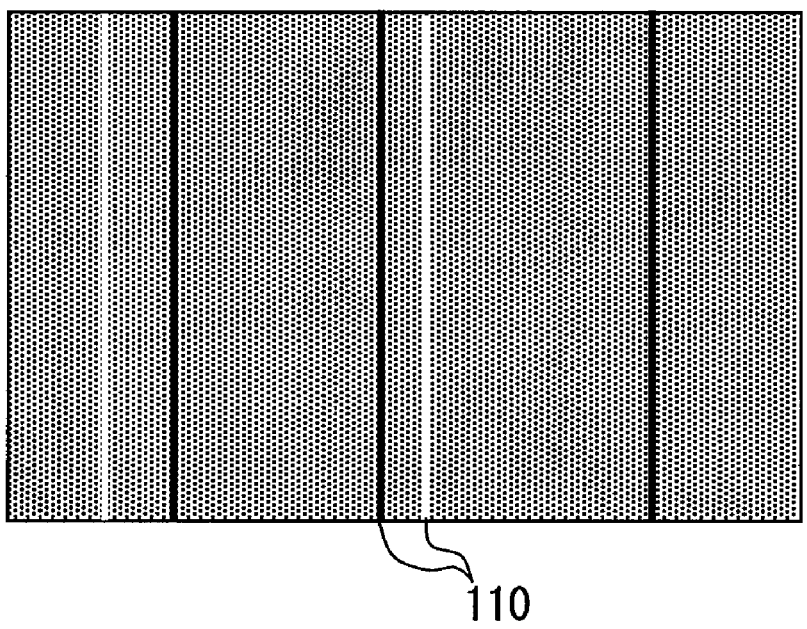
110

PRIOR ART

OFFSET CANCELLATION CIRCUIT AND DISPLAY DEVICE

BACKGROUND OF THE INVENTION

1. Field of the Invention

The present invention relates to a differential amplifier and an offset cancellation circuit, more particularly to a technology for making an accurate voltage deliver rapid and low-impedance drive performance. The present invention is preferably applied to, for example, a liquid crystal or organic EL display device in which a liquid crystal display driver or an organic EL driver is installed.

2. Description of the Related Art

Operational amplifiers are conventionally often used to amplify analog signals and difference signals. An operational amplifier is an elementary circuit and a large number of operational amplifiers are incorporated in, for example, LSI. An output signal of an operational amplifier includes an error resulting from the variability in characteristics of transistors constituting the operational amplifier. Because of the error thus generated, in the operational amplifier, an input signal, for example, 0V, does not necessarily become an output signal 0V. The error of the output signal with respect to the input signal is called an offset voltage.

Conventionally, various measures were taken for operational amplifiers, such as optimized circuit designs and layout designs of a differential amplifier and an active load, in order to reduce the offset voltage (for example, see Non-Patent Literature ("ANALOG INTEGRATED CIRCUIT DESIGN" written by DAVID A. JOHS and KEN MARTIN, P. 105-P. 118, P. 229-P. 231, JOHN WILLY & SONS, INC, 1997).

However, the combination of the before-mentioned design techniques, without an offset cancellation function for canceling the offset voltage, has its limitation in reducing the offset voltage.

Below is described what causes the generation of the offset voltage in the operational amplifier. There are two types of offset voltages, which are a systematic offset voltage and a random offset voltage. The systematic offset voltage, which is induced by a manufacturing process for the circuit or layout per se, can be controlled by adopting the design techniques described earlier.

However, a main cause of the random offset voltage is the variability of transistor characteristics which occurs with a certain probability in a semiconductor manufacturing process. Therefore, it is extremely difficult to reduce the random offset voltage by merely adjusting the circuit and layout designs in the operational amplifier. Therefore, it is an effective way to provide an offset cancellation function in the operational amplifier or a buffer circuit so as to deal with the random offset voltage as well.

Examples of an offset cancellation circuit provided with the offset cancellation function include the first offset cancellation circuit recited in No. 2004-350256 of the Japanese Patent Applications Laid-Open and the second offset cancellation circuit recited in No. 2005-117547A of the Japanese Patent Applications Laid-Open.

As illustrated in FIG. 13, the first offset cancellation circuit comprises an operational amplifier, a capacitor and switches, wherein a voltage corresponding to an offset voltage is stored in the capacitor, and a computing process is performed for the stored voltage and an input voltage of the operational amplifier, so that the offset voltage is reduced.

As illustrated in FIG. 14, the second offset cancellation circuit comprises first and second differential amplifiers, a capacitor, and switches. According to the constitution, the same voltage is applied to two inputs of the first differential amplifier, and the capacitor is connected to two inputs of the second differential amplifier, and then, the first differential amplifier is operated by a voltage follower. Then, voltages to be supplied to the two inputs of the second differential amplifier are set such that: the input voltage is supplied to one of them; and an open state is set in the other (voltage stored in the capacitor is inputted thereto). Then, the second differential amplifier is switched to the voltage follower.

The first and second offset cancellation circuits have the following problems. In the first offset cancellation circuit, because charges stored in the capacitor vary via a parasitic capacitance when the switches are opened and closed, the variation of the charges appears as the offset voltage. What needs to be done in order to reduce the influences of the variation of charges is that a capacitance of the capacitor is increased so that the parasitic capacitance is apparently reduced. However, the increase of the capacitance of the capacitor leads to the increase of a chip size and makes it necessary to extend a time period during which the offset voltage is stored. The offset storage time period is determined by the product of a resistance value of the switch in a conducting state and a capacitance value of the capacitor. When the capacitance value of the capacitor is set to be larger in order to deal with the offset problem, therefore, a processing rate is consequently lowered.

In the second offset cancellation circuit, since the first differential amplifier operates even while the offset voltage is being cancelled, the voltage can still be outputted from the operational amplifier (more specifically, the first differential amplifier) during the offset cancellation period. However, the offset voltage is added to the voltage outputted from the operational amplifier in that case. When the second differential amplifier starts to operate, the output voltage in which the offset voltage is reduced can be outputted, and an accurate voltage can be rapidly outputted. The first differential amplifier provided so as to reduce the offset voltage, however, has the following three disadvantages.

One of the disadvantages is described below. As described, two differential amplifiers constitute the operational amplifier, which can be inherently comprised of a single differential amplifier. Therefore, a required area and a required volume of current are simply doubled. The second disadvantage is that such an area increase invites the increase of costs.

In the case where the constitution of the second offset cancellation circuit is adopted in a liquid crystal driver or an organic EL driver, it is necessary to provide such constitution for each of scanning lines. As a result, the number of the operational amplifiers to be further provided will be as many as approximately 400-1,000, and influences of the increase in the area and current consumption of one operational amplifier will increase by at least 400 times on the whole. Such enormous influences are never ignorable in a display device used in a liquid crystal television, an organic EL television, and the like.

The third disadvantage is described below. Even if the variability of the characteristics of the transistors constituting the second differential amplifier due to a manufacturing process does not exist, the variability of the characteristics of the transistors constituting the first differential amplifier may exist. When such variability exists, the offset voltage which would not occur in the absence of the second offset cancellation circuit is unnecessarily added.

As so far described, the processing rate is increased, and the output voltage can be made more accurate by the second offset cancellation circuit. However, the reduction of the required area, power consumption, manufacturing costs and the like is still an issue yet to be solved.

SUMMARY OF THE INVENTION

Therefore, a main object of the present invention is to provide an offset cancellation circuit capable of outputting an input voltage at a high processing rate and with a high accuracy and a low impedance while preventing power consumption and a chip area from increasing even when an offset cancellation function is provided in an operational amplifier.

1) An offset cancellation circuit according to the present invention is an offset cancellation circuit provided in an operational amplifier, configured such that a first active load is connected to a first differential pair, the first differential pair comprises a first inversion input unit and a first non-inversion input unit, the first active load comprises a first and second transistors, and the first and second transistors each comprise a gate, comprising:

an input unit for inputting an input voltage to the first non-inversion input unit;

a first capacitance connected to the gate of the first transistor;

a second capacitance connected to the gate of the second transistor; and a switch for setting a first time period and a second time period in connection states between the first and second transistors and the first and second capacitances, wherein during the first time period, the connection states between the first and second transistors and the first and second capacitances are set so that a gate voltage of the first transistor is supplied to the first capacitance, and a gate voltage of the second transistor is supplied to the second capacitance, and during the second time period, the connection states between the first and second transistors and the first and second capacitances are set so that the first and second capacitances can retain charges and the second time period is an output time period of the operational amplifier. FIG. 1 described later in preferred embodiments of the present invention can be referenced for this constitution.

According to the constitution, the offset cancellation circuit can be provided without increasing power consumption and a chip area.

2) An offset cancellation circuit according to the present invention is the offset cancellation circuit constituted as in 1), further comprising:

a first output unit from which an output of the operational amplifier is outputted;

a second differential pair comprising a second inversion input unit and a second non-inversion input unit, the input voltage being supplied to the second non-inversion input unit; and a second active load connected to the second differential pair, wherein during the first time period, the connection states between the first and second transistors and the first and second capacitances, and a connection status between the second differential pair and the second active load are set so that the second differential pair and the second active load are operated when the second inversion input unit and the first output unit are connected to each other, thereby allowing the output from the operational amplifier, and during the second time period, the connection states between the first and second transistors and the first and second capacitances, and the connection state between the second differential pair and the second active load are set so that the first differential pair and the first active load are operated, thereby allowing the output from the operational amplifier. FIG. 2 described later in the preferred embodiments of the present invention can be referenced for this constitution.

According to the constitution, the voltage can be outputted in a time period during which the offset voltage is stored. Therefore, an offset cancellation circuit that can output the input voltage at a high processing rate and with a high accuracy and a low impedance can be provided.

3) An offset cancellation circuit according to the present invention is the offset cancellation circuit constituted as in 1), further comprising:

a first output unit from which an output of the operational amplifier is outputted;

a third transistor combined with the first transistor, thereby constituting a first cascode circuit;

a fourth transistor comprising a drain and a source, the fourth transistor combined with the second transistor, thereby constituting a second cascode circuit;

a phase compensation capacitance provided between the source of the fourth transistor and the first output unit; and a second output unit connected to the drain of the fourth transistor, the second output unit outputting an output of the first differential pair and an output of the first active load. FIG. 3 described later in the preferred embodiments of the present invention can be referenced for this constitution.

According to the constitution, the offset voltage can be more accurately stored and supplied and a level of precision is improved.

4) An offset cancellation circuit according to the present invention is the offset cancellation circuit constituted as in 1), configured such that, the operation amplifier is configured as a voltage follower, and the offset cancellation circuit further comprises:

a first output unit from which an output from the operational amplifier is outputted;

a high-side transistor which is a drive transistor on the side of a high power supply of the first output unit; and a low-side transistor which is a drive transistor on the side of a low power supply of the first output unit, wherein during the first time period, the connection states between the first and second transistors, the first and second capacitances, the first output unit, the high-side transistor and the low-side transistor are set so that the input voltage is inputted to the input unit when the first inversion input unit, the first non-inversion input unit and the first output unit are connected to one another, and during the second time period, the connection states between the first and second transistors, the first and second capacitances, the first output unit, the high-side transistor and the low-side transistor are set so that the second time period becomes the output time period of the operational amplifier. FIG. 4 described later in the preferred embodiments of the present invention can be referenced for this constitution.

According to the constitution, the voltage variation of the phase compensation capacitance is smaller in the time periods during which the offset voltage is stored and the voltage is outputted. As a result, an amount of time necessary for recharging can be reduced, and a higher processing rate can be expected.

5) Preferably, a first bias voltage for operating the high-side transistor in a saturation region or a second bias voltage for operating the low-side transistor in the saturation region is applied to the operational amplifier in the offset cancellation circuit as constituted in 4).

6) An offset cancellation circuit according to the present invention is the offset cancellation circuit constituted as in 2), 3) or 4), configured such that, the second active load comprises a fifth and sixth transistors, and the offset cancellation circuit further comprises:

a seventh transistor combined with the fifth transistor, thereby constituting a third cascode circuit; and an eighth transistor combined with the sixth transistor, thereby constituting a fourth cascode circuit. FIG. 5 described later in the preferred embodiments of the present invention can be referenced for this constitution.

7) An offset cancellation circuit according to the present invention is the offset cancellation circuit constituted as in 6), configured such that:

the eighth transistor comprises a source, the phase compensation capacitance comprises a pair of terminals, and the switch controls a connection between the source of the fourth transistor and one terminal of the phase compensation capacitance, a connection between the source of the eighth transistor and the one terminal of the phase compensation capacitance, and a connection between the other terminal of the phase compensation capacitance and the first output unit, so that charging and discharging time periods in the phase compensation capacitance during the first time period are shortened. FIG. 6 described later in the preferred embodiments of the present invention can be referenced for this constitution.

According to the constitution, the configuration of cascode mirror compensation superior in a high processing rate to mirror phase compensation can be obtained. As a result, high-speed voltage operation is realized.

8) Preferably, the third transistor, the fourth transistor, the seventh transistor and the eighth transistor are the same in terms of transistor performance, transistor size, or gate voltage in the offset cancellation circuit as constituted in 6).

According to the constitution, the voltage variation of the phase compensation capacitance is kept small, and an even higher processing rate can be thereby realized.

9) Preferably, equal bias voltages are applied to the gate of the third transistor, the gate of the fourth transistor, the gate of the seventh transistor and the gate of the eighth transistor so that the first time period is shortened in the offset cancellation circuit as constituted in 6) or 7).

According to the constitution, a potential variation of the phase compensation capacitance between the first time period for the offset cancellation and the second time period for the output of the operational amplifier is further reduced. As a result, the time period for storing offset voltage can be shortened.

10) An offset cancellation circuit according to the present invention is an offset cancellation circuit provided in an operational amplifier, configured such that a first active load is connected to a first differential pair, the first differential pair comprises a first inversion input unit and a first non-inversion input unit, the first active load comprises a first and second transistors, and the first and second transistors each comprise a gate, comprising:

an input unit for inputting an input voltage to the first non-inversion input unit;

an output unit from which an output of the operational amplifier is outputted;

a third transistor comprising a gate, the third transistor and the first transistor constituting a pair;

a fourth transistor comprising a gate, the fourth transistor and the second transistor constituting a pair;

a first impedance unit provided between the third transistor and a power supply or between the third transistor and a ground;

a first capacitance provided in parallel with the first impedance unit;

a second impedance unit provided between the fourth transistor and the power supply or between the fourth transistor and the ground;

a second capacitance provided in parallel with the second impedance unit; and a switch for setting a first time period and a second time period in connection states among the first-fourth transistors, the first and second capacitances and the first and second impedance units, wherein the gate of the first transistor and the gate of the third transistor are connected to each other, the gate of the second transistor and the gate of the fourth transistor are connected to each other, the connection states among the first-fourth transistors, the first and second capacitances and the first and second impedance units are set during the first time period so that:

the first non-inversion input unit and the first inversion input unit are connected to each other, a current of the third transistor which is equal to or proportional to a current of the first transistor is converted into a voltage by the first impedance unit, and a first charge corresponding to the converted voltage can be retained in the first capacitance; and a current of the fourth transistor which is equal to or proportional to a current of the second transistor is converted into a voltage by the second impedance unit, and a second charge corresponding to the converted voltage can be retained in the second capacitance, and the connection states among the first-fourth transistors, the first and second capacitances and the first and second impedance units are set during the second time period so that:

the first inversion input unit and the output unit are connected to each other, and a current corresponding to the charge retained in the first capacitance is supplied to the first transistor via the third transistor; and the second time period becomes an output time period of the operational amplifier when a current corresponding to the charge retained in the second capacitance is supplied to the second transistor via the fourth transistor.

According to the constitution, the charged currents of the first and second capacitances can be directly increased or decreased irrelevant to the characteristic of the operational amplifier. Accordingly, an amount of time for charging the first and second capacitances, which is the offset storage time in the offset cancellation circuit, can be adjusted in a wider range, and wider selectable ranges are available for electric power and the offset cancellation time period.

11) In the offset cancellation circuit in 10), resistors, inductors or transistors constitute the first and second impedance units.

12) A display device according to the present invention comprises:

a plurality of the offset cancellation circuits in 1) and 10); and a liquid crystal cell in which a light transmission factor varies or an organic EL cell in which a brightness level of light emission varies, depending on an output voltage of the offset cancellation circuit.

According to the constitution, the offset voltage in a drive circuit or any display irregularity caused by the variability in offset voltages can be controlled. As a result, a high image quality can be obtained.

As thus far described, according to the present invention, an offset cancellation circuit capable of outputting an input voltage at a high processing rate and with a high accuracy and a low impedance while preventing power consumption and a chip area from increasing can be provided.

Further, power consumption can be reduced on the whole in a display device comprising a liquid crystal/organic EL panel, a liquid crystal TFT/organic EL element or the like, and a voltage suitable for the liquid crystal TFT/organic EL element (high-rate drive voltage in which the offset voltage of the operational amplifier is significantly reduced) can be supplied from the output of the operational amplifier provided by each cell. These achievements can greatly contribute to the development of a liquid crystal/organic EL display device in which high contrast and brightness level are attained.

According to the present invention, the offset voltage can be controlled, and the low-impedance output can be realized in a voltage generating circuit such as a liquid crystal display driver, an organic EL driver or the like. In the case where the present invention is applied to a source driver, the offset voltages of a plurality of operational amplifiers can be collectively controlled. As a result, a liquid crystal drive circuit, wherein the variability of a plurality of output terminals is reduced, a high processing rate is realized, and voltage deviation is avoided, can be provided.

BRIEF DESCRIPTION OF THE DRAWINGS

These and other objects of the invention will become clear by the following description of preferred embodiments of the invention and be specified in the claims attached hereto. A number of benefits not recited in this specification will come to the attention of the skilled in the art upon the implementation of the present invention.

FIG. 1 is a circuit diagram illustrating a constitution of an offset cancellation circuit according to a preferred embodiment 1 of the present invention.

FIG. 4 is a circuit diagram illustrating a constitution of an offset cancellation circuit according to a preferred embodiment 4 of the present invention.

FIGS. 11A and 11B are block diagrams illustrating a constitution of a display device wherein the offset cancellation circuit according to the present invention is used.

FIGS. 12A and 12B are schematic views of display status by a display device.

DETAILED DESCRIPTION OF THE INVENTION

Figure 2:
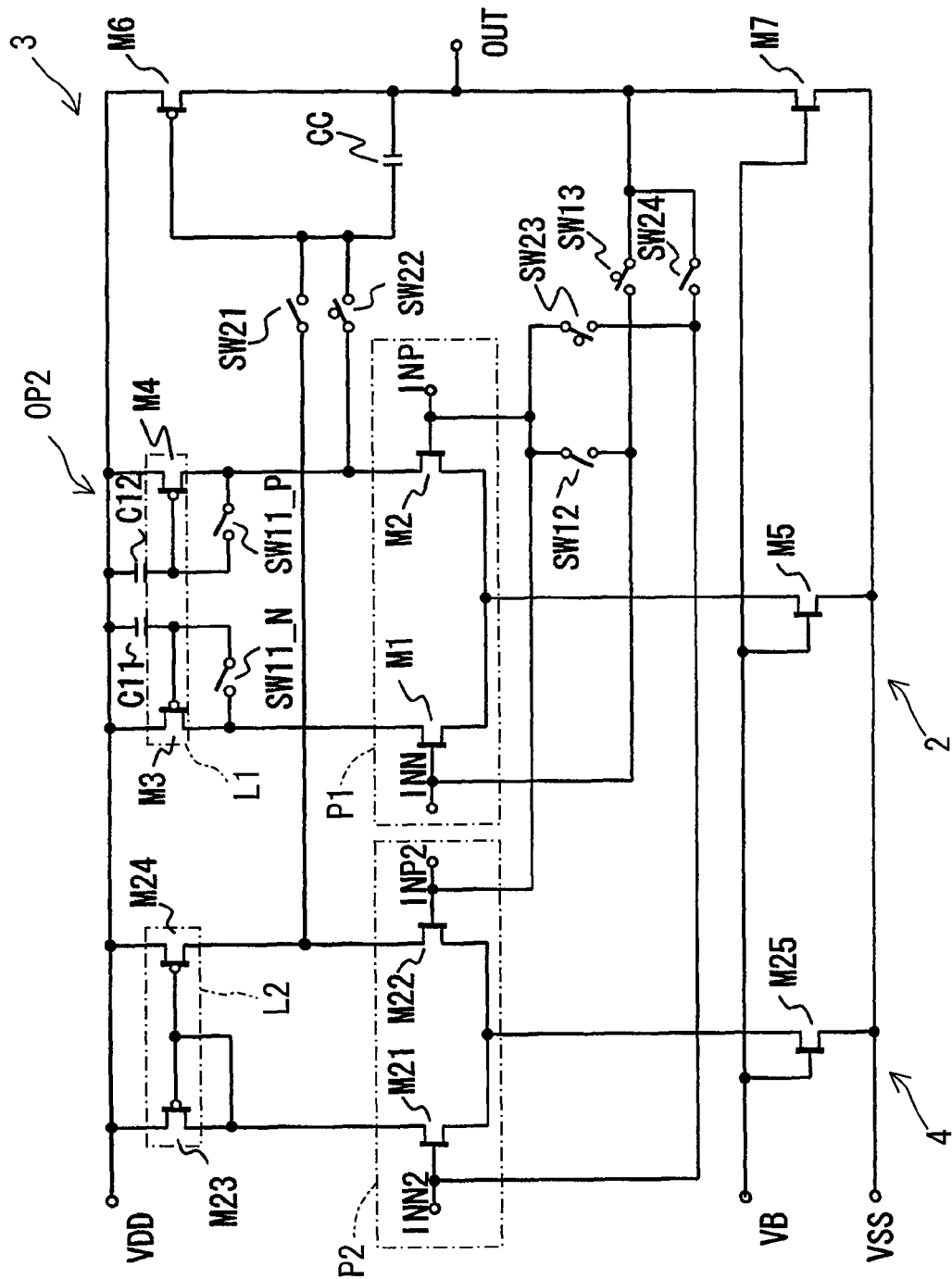
FIG. 2 is a circuit diagram illustrating a constitution of an offset cancellation circuit according to a preferred embodiment 2 of the present invention.

Hereinafter, preferred embodiments of an offset cancellation circuit according to the present invention are described in detail referring to the drawings. The same or corresponding structural components in the drawings are provided with the same reference symbols, and will not be described repeatedly.

Preferred Embodiment 1

Figure 9:
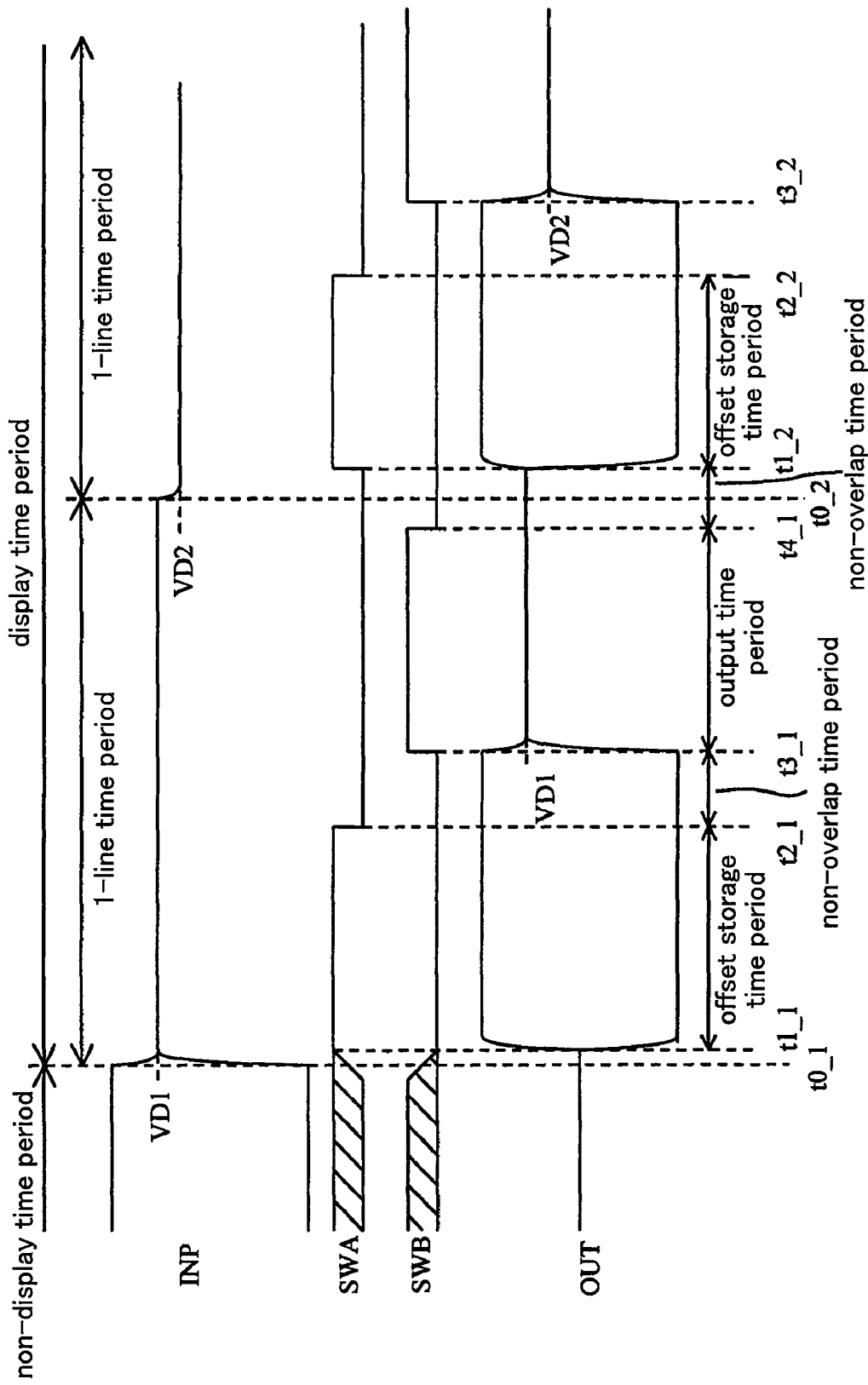
FIG. 9 is a timing chart illustrating control signals and an operation according to the preferred embodiment 1.

FIG. 1 is a circuit diagram illustrating a constitution of an offset cancellation circuit 1 according to a preferred embodiment 1 of the present invention. FIG. 9 is a timing chart illustrating control timing of the offset cancellation circuit 1.

The offset cancellation circuit 1 is provided in an operational amplifier OP1. The operational amplifier OP1 comprises a differential amplifier 2. The differential amplifier 2 comprises a first differential pair P1, a first active load L1 and a transistor M5. The first differential pair P1 comprises transistors M1 and M2. The first active load L1 comprises transistors M3 and M4. The transistor M5 controls a tail current of the first differential pair P1.

The offset cancellation circuit 1 comprises transistors M6 and M7, capacitances C11, C12 and CC, and switches SW11_N, SW11_P, SW12 and SW13. The transistor M6 buffers an output of the differential amplifier 2 and outputs the resulting output. An output of the first differential pair P1 (transistors M1 and M2) and an output of the first active load L1 (transistors M3 and M4) are inputted to the transistor M6. The transistor M7 buffers the output of the differential amplifier 2 and outputs the resulting output in a manner similar to the transistor M6. The transistor M7 and the transistor M5 constitute a pair, thereby operating as a current mirror circuit. The current mirror circuit is controlled by a bias voltage VB.

The capacitance C11 is a capacitance in which charges of a gate voltage of the transistor M3 are retained. The capacitance C12 is a capacitance in which charges of a gate voltage of the transistor M4 are retained. The switch SW11_N controls a gate-drain connection of the transistor M3. The switch SW11_P controls a gate-drain connection of the transistor M4. The switch SW12 controls a connection between a gate of the transistor M2 (non-inversion input unit of the operational amplifier OP1) and a gate of the transistor M1 (inversion input unit of the operational amplifier OP1). The switch SW13 controls a connection between the gate of the transistor M1 (inversion input unit of the operational amplifier OP1) and a drain of the transistor M6 (output unit of the operational amplifier OP1). The capacitance CC is a phase compensation capacitance of the operational amplifier OP1.

The switches SW11_N, switch SW11_P and SW12 are opened and closed based on a control signal SWA (see FIG. 9). These switches are in a conducting state when the control signal SWA is in an H state, while they are in a non-conducting state when the control signal SWA is in an L state. The switch SW13 is opened and closed based on a control signal SWB (see FIG. 9). The switch SW13 is in the conducting state when the control signal SWB is in the H state, while it is in the non-conducting state when the control signal SWB is in the L state.

An operation of the offset cancellation circuit 1 thus constituted is described referring to the timing chart illustrated in FIG. 9. A non-display time period shown therein is a time period from a time point to through a time point t0_1, and this time period is a time period set based on a video data signal. A 1-line time period is a time period from the time point t0_1 through a time point t0_2. This time period is a time period from a time point when the control signal SWA is switched to the H state through a termination time point of the 1 line which is determined based on the video data signal. A display time period is a time period during which a time point satisfies t>=t0_1. This time period is set based on the video data signal. An offset time period is a time period from a time point t1_1 through a time point t2_1. A non-overlap time period is a time period during which the H states of the control signals SWA and SWB do not overlap. An output time period is a time period from a time point t3_1 through a time point t0_2. This time period is a time period from a time point when the control signal SWB is switched to the H state through the termination time point of the 1 line. The definitions of these time periods described in the present preferred embodiment are also applied to any other preferred embodiment in this description.

Next, reference symbols shown in the respective time points are described. A time point tM_N denotes timing M after N lines since a display start. The N denotes the number of lines in a display device (for example, N=240 in a display device of QVGA size, N=480 in a display device of VGA size). M denotes timing of the cancellation of an offset voltage, and M=0, 1, 2, 3 and 4. An operation at each time point performed when the M value is changed is described in detail below. First, an operation in a general offset cancellation system including the present preferred embodiment during a time period up to the time point t1_1 is described below.

Time Period Up to Time Point t0_1

This time period is the non-display time period, during which an input INP (input voltage to the transistor M2) is in an HI-Z (high impedance) state, and the control signals SWA and SWB are ignorable.

Time Point t0_1

At this time point, the non-display time period shifts to the display time period. When this time point arrives, a voltage VD1 is applied to the input INP.

Time Point t1_1

At this time point, an offset storage time period starts, and the control signal SWA shifts to the H state, while the control signal SWB shifts to the L state. At this time point, the switches SW11_N, SW11_P and SW12 are in the conducting state, while the switch SW13 is in the non-conducting state.

At the time point t1_1, all node voltages are expected to be equal in the transistors M1 and M2 constituting the first differential pair P1 and the transistors M3 and M4 constituting the first active load L1. In the case where characteristics of these transistors M1-M4 vary, however, currents flowing in the transistors M1 and M2 and gate-source voltages of the transistors M3 and M4 become out of sync although equal voltages have been applied to the transistors M1 and M2. These voltage differences become the cause of the random offset voltage. The variability of the characteristics, which is triggered by local process variability, affects the circuits. As a result, offset voltage appears. The characteristic variability is a phenomenon wherein a transistor is properly manufactured to meet its required quality as a product; however, the characteristic value of the manufactured transistor practically deviates from its representative value though the transistor can still be turned on and off. The characteristic variability occurs with a given percentage in the manufacturing process. Hereinafter, the characteristic variability is called mismatch.

Figure 15:
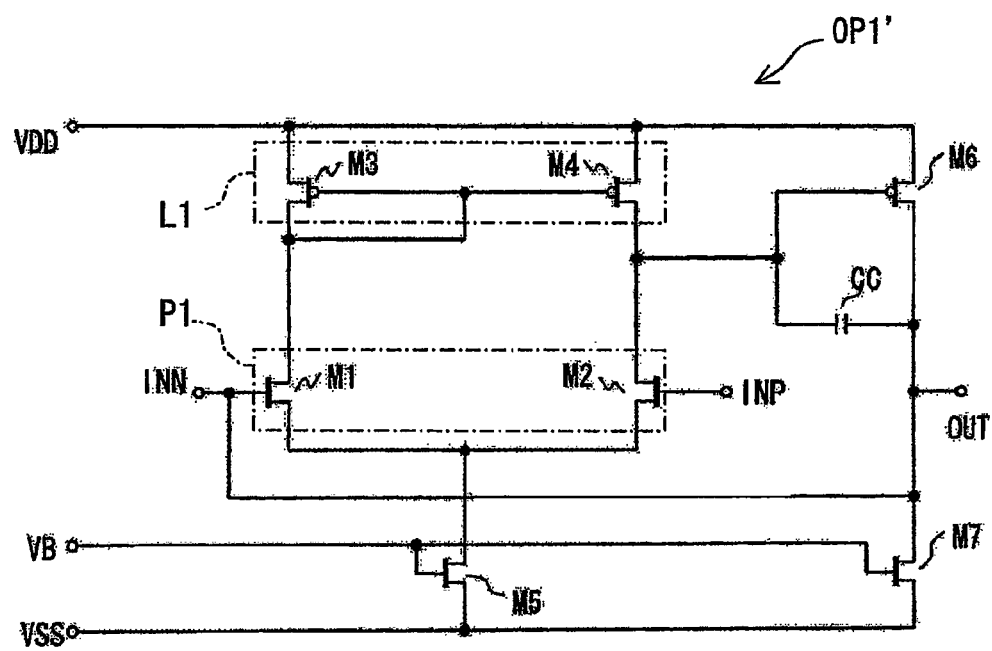
FIG. 15 is a circuit diagram of an operational amplifier in which the offset cancellation circuit is not provided.

Based on the description given above, an operation in the case where the transistors M1, M3 and M4 are manufactured so as to have such characteristics that satisfy their design values, and the transistor M2 is manufactured in such a way that its performance is higher than its design value (or its threshold value VT is low) due to mismatch is described referring to FIG. 15. FIG. 15 illustrates an operational amplifier OP1', in which the offset cancellation circuit 1 is removed from the operational amplifier OP1.

In the operational amplifier OP1', since the performance of the transistor M2 is higher than its design value, a larger number of currents tend to flow in the transistor M2 than its design value. Then, a drain voltage of the transistor M2 is lowered than a voltage shown in the case where the mismatch does not occur, and a gate voltage of the transistor M6 goes down. Accordingly, an output OUT of the operational amplifier OP1' is increased, and the output voltage OUT is negative-feedbacked relative to a gate voltage of the transistor M1. When the gate voltage of the transistor M1 goes up as a result of the negative feedback, and the current thereof becomes equal to the current of the transistor M2, the operational amplifier OP1' is brought to a stationary state. Consequently, the same current flows in the transistors M3 and M4 constituting the first active load L1, and the operations of these transistors can be stabilized. This increase portion of the output voltage OUT is the offset voltage of the operational amplifier OP1'. Thus, the operational amplifier OP1', in which the offset cancellation circuit 1 is not provided, is operated with the offset voltage being retained therein.

On the other hand, in the offset cancellation circuit 1, even if the mismatch occurs, the current and voltage of the mismatch portion are stored in the capacitances C11 and C12 provided at the gates of the transistors M3 and M4 during the offset storage time period. More specifically, the increase portion of the current and voltage generated because the performance of the transistors M1 and M2 constituting the first differential pair P1 exceeds their design values are stored as charges in the capacitances C11 and C12, and the switches SW11_N and SW11_P are set to the non-conducting state, so that the charges stored in the capacitances C11 and C12 are retained. Accordingly, the voltage VD1, in which the influences of the manufacturing variability in the first differential pair P1 (transistors M1 and M2) and the first active load L1 (transistors M3 and M4) are taken into consideration, can be outputted as the voltages of the first active load L1 (transistors M3 and M4). The voltage VD1 becomes a value reflecting finishing states of the manufactured transistors M1-M4. As a result, the voltage at a suitable operation point can be stored.

Hereinafter, the operation of the offset cancellation circuit 1 is described referring to the timing chart illustrated in FIG. 9 again.

Time Point t2_1

At this time point, the offset storage time period ends, and the non-overlap time period starts. When this time point arrives, the switches SW11_N and SW11_P are in the non-conducting state, and the capacitances C11 and C12 are ready to retain the charges. A time period from the time point t2_1 through the time point t3_1 is the non-overlap time period. During this time period, the switches SW11_N and SW11_P are in the non-conducting state, and the switches SW12 and SW13 are also in the non-conducting state. During this time period, inflow/outflow paths for the charges stored in the capacitances C11 and C12 (which are the offset voltages of the transistors M1-M4) are blocked so that the charges can be reliably retained.

It is important to accurately store the charges by setting the non-overlap time period in performing the offset cancellation. In the present invention, the non-overlap time period (time period during which neither the control signal SWA nor the control signal SWB is in the H state) is set in a time period during the transition of the H state from the control signal SWA to the control signal SWB and a time period during the transition of the H state from the control signal SWB to the control signal SWA not only in the present preferred embodiment but also in the other preferred embodiments. Accordingly, the charges (offset voltage) can be reliably stored in the capacitances C11 and C12.

Time Point t3_1

At this time point, the non-overlap time period ends, and the output time period starts. When this time point arrives, the switch SW13 is in the conducting state. Because the non-overlap time period (time period during which both of the control signals SWA and SWB do not shift to the H state at the same time) is provided before the output time period, the charges stored in the capacitances C11 and C12 are surely retained. During the output time period, the transistors M3 and M4 are operated at a suitable operation point appropriate to the input voltage VD1 based on the charges of the capacitances C11 and C12 in which the mismatch portions of the transistors M1-M4 are stored. As a result, the offset voltage is reduced. The output time period is a time period from the time point t3_1 through a time point t4_1. During the output time period, the operational amplifier OP1 unfailingly outputs the input voltage VD1.

Time Point t4_1

At this time point, the switch SW13 is in the non-conducting state, and the output time period ends.

Time Point t0_2

At this time point, the operation proceeds to the offset cancellation for the next line.

The operation described so far is repeatedly executed. As a result, the output voltage, in which the offset voltage is controlled, can be outputted with respect to input voltage of each line.

Preferred Embodiment 2

Figure 10:
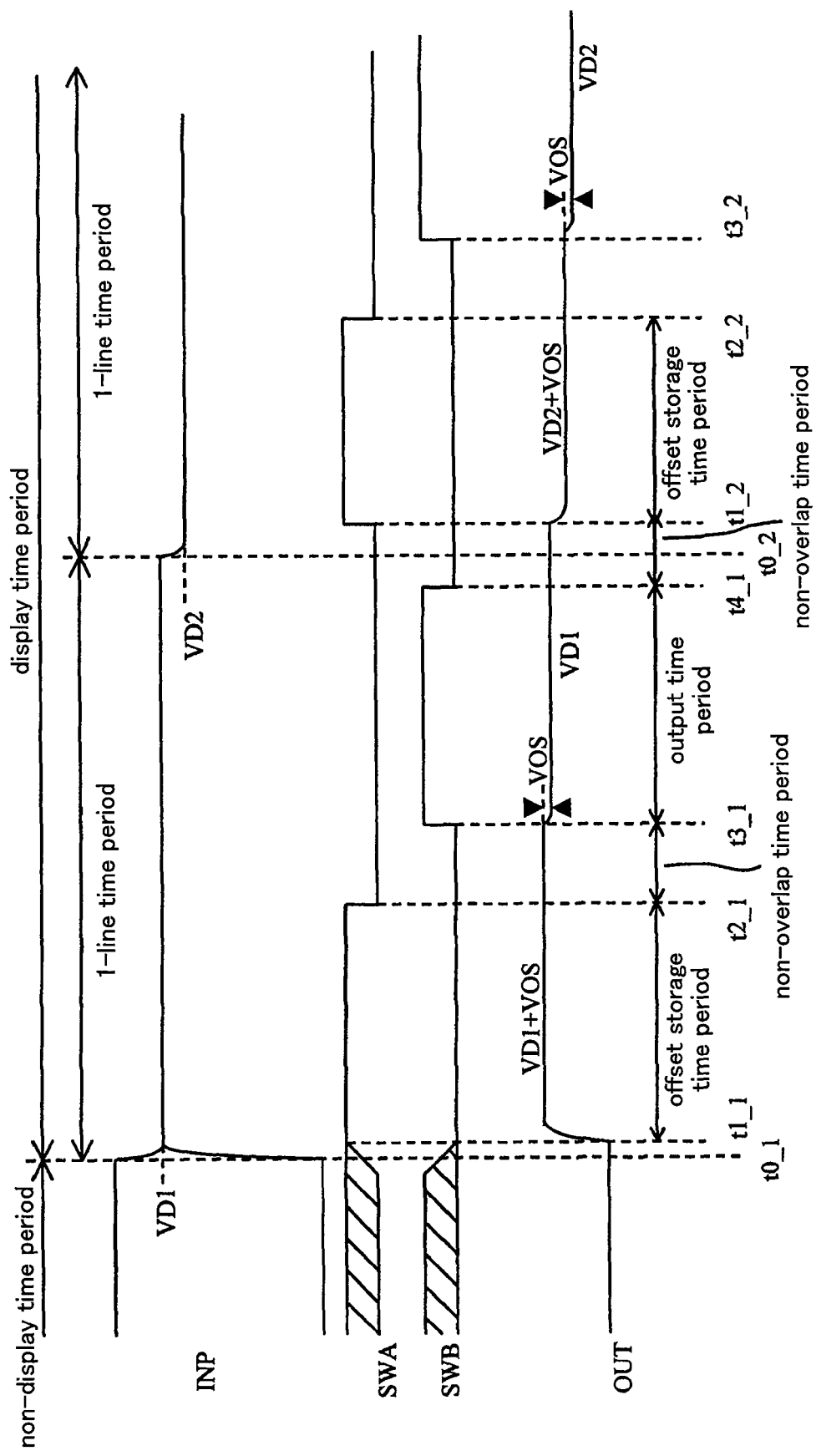
FIG. 10 is a timing chart illustrating control signals and an operation according to the preferred embodiment 2.
Figure 13:
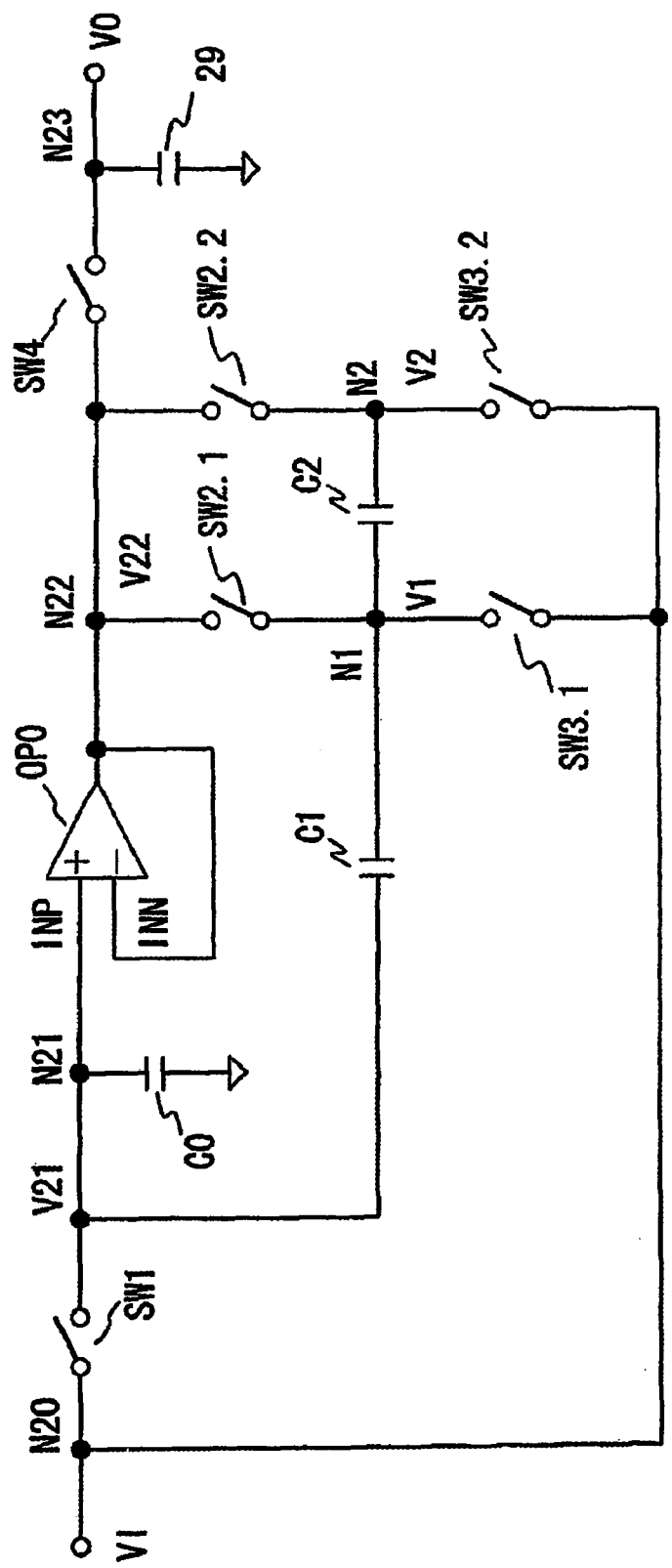
FIG. 13 is a circuit diagram illustrating a constitution of a conventional offset cancellation circuit.
Figure 14:
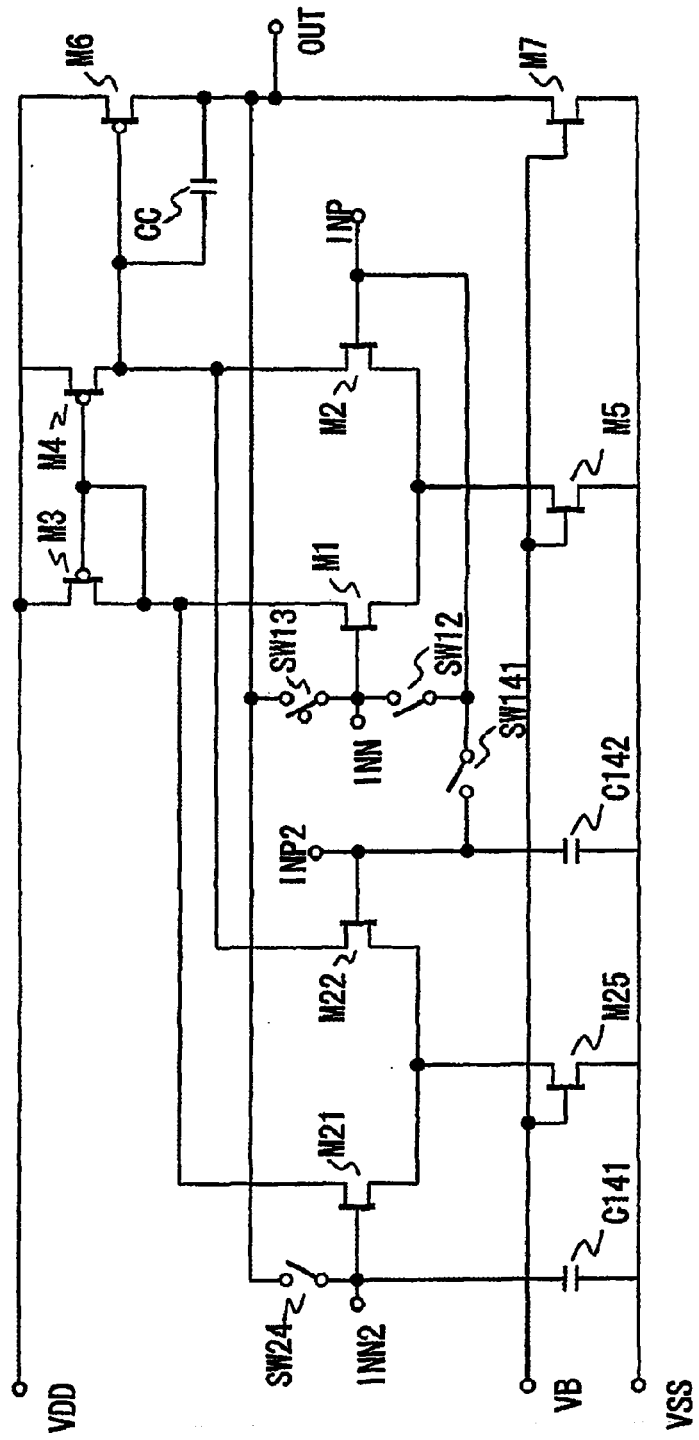
FIG. 14 is a circuit diagram illustrating a constitution of another conventional offset cancellation circuit.

FIG. 2 is a circuit diagram illustrating a constitution of an offset cancellation circuit 3 according to a preferred embodiment 2 of the present invention. FIG. 10 is a timing chart illustrating control timing of the offset cancellation circuit 3.

The offset cancellation circuit 3 comprises a differential amplifier 4 for offset cancellation in addition to the structural components described in the preferred embodiment 1. The differential amplifier 4 for offset cancellation comprises a second differential pair P2, a second active load L2, a transistor M25, and switches SW21, SW22, SW23 and SW24. In the preferred embodiment 2, these structural components constitute an operational amplifier OP2. In FIG. 2, the same structural components as those described referring to FIG. 1 are shown with the same reference symbols attached thereto and will not be described in detail.

The second differential pair P2 comprises transistors M21 and M22. The second active load L2 comprises transistors M23 and M24. The transistor M25 controls a tail current of the second differential pair P2. The switch SW22 controls a connection between a gate of the transistor M6 and an output unit of the differential amplifier 2 (transistors M1-M5). The switch SW21 controls a connection between the gate of the transistor M6 and an output unit of the differential amplifier 4 for offset cancellation (transistors M21-M25). The switch SW23 controls a connection between the gate of the transistor M2 (non-inversion input unit of the operational amplifier OP2) and a gate of the transistor M21 (inversion input unit of the second differential pair P2). The switch SW24 controls a connection of the gate of the transistor M21 (inversion input unit of the second differential pair P2) and a drain of the transistor M6 (output unit of the operational amplifier OP2). The switches SW21 and SW24 are opened and closed based on the control signal SWA (see FIG. 10) as in the case of the switches SW11_N, SW11_P and SW12. The switches SW21 and SW24 are in the conducting state when the control signal SWA is in the H state, while they are in the non-conducting state when the control signal SWA is in the L state. The switches SW22 and SW23 are opened and closed based on the control signal SWB (see FIG. 10) as in the case of the switch SW13. The switches SW22 and SW23 are in the conducting state when the control signal SWB is in the H state, while they are in the non-conducting state when the control signal SWB is in the L state.

An operation of the offset cancellation circuit 3 thus constituted is described referring to the timing chart illustrated in FIG. 10. A non-display time period shown therein is a time period from a time point t0 through a time point t0_1. During this time period, an input INP (input voltage to the transistor M2) is in the HI-Z state, and the controls signals SWA and SWB are ignorable.

Time Point t0_1

At this time point, the non-display time period shifts to the display time period. When the time point t0_1 arrives, a voltage VD1 is applied to the input INP.

Time Point t1_1

This time point is a time point when the offset storage time period arrives in the display time period. When this time point arrives, the control signal SWA shifts to the H state, while the control signal SWB shifts to the L state. At this time point, the switches SW11_N, SW11_P, SW12, SW21 and SW24 are in the conducting state, while the switches SW13 and SW22 are in the non-conducting state.

As is the case with the preferred embodiment 1, an operation performed in the case where the transistors M1, M3 and M4 are manufactured so as to have such characteristics that satisfy their design values, and the transistor M2 is manufactured in such a way that its performance is higher than its design value (or its threshold value VT is low) due to mismatch; thus the random offset voltage is generated, is described below.

Time Point t2_1

At this time point, the offset storage time period ends, and the non-overlap time period starts. When this time point arrives, the switches SW11_N and SW11_P are in the non-conducting state, and the capacitances C15 and C12 are ready to store the charges. A time period from the time point t2_1 through a time point t3_1 is the non-overlap time period. An effect obtained by setting the non-overlap time period is as described in the preferred embodiment 1.

Time Point t3_1

At this time point, the non-overlap time period ends, and the output time period starts. When this time point arrives, the switches SW13, SW22 and SW23 are in the conducting state. During the output time period, the transistors M3 and M4 are operated at a suitable operation point appropriate to the input voltage VD1 based on the charges of the capacitances C11 and C12 in which the mismatch portions of the transistors M1-M4 are stored. As a result, the input voltage VD1, in which the offset voltage is reduced, is outputted. The output time period is a time period from the time point t3_1 through a time point t4_1. During the output time period, the input voltage VD1 can be unfailingly outputted.

Time Point t4_1

At this time point, the switch SW13 is in the non-conducting state, and the output time period ends.

Time Point t0_2

At this time point, the operation proceeds to the offset cancellation for the next line.

The operation described so far is repeatedly executed. Accordingly, the output voltage, in which the offset voltage is reduced, can be outputted with respect to input voltage of each line.

In the offset cancellation circuit 3:
the current and voltage of mismatch portions are stored in the capacitances C11 and C12 connected to the gates of the transistors M3 and M4;
the input voltage VD1 is connected to the non-inversion input unit of the differential amplifier 4 for offset cancellation;
the drain of the transistor M6 is connected to the inversion input unit of the differential amplifier 4 for offset cancellation; and
the output voltage of the differential amplifier 4 for offset cancellation is applied to the gate of the transistor M6.

Therefore, a voltage, in which an offset voltage VOS is added to the input voltage VD1, (VD1+VOS), is outputted. More specifically, the offset cancellation circuit 3 includes the offset voltage VOS; however, is still capable of outputting a voltage close to the input voltage VD1. Furthermore, during the time period up to the output time period (time period up to the time point t3_1), the output voltage is VD1+VOS. Therefore, the variation of the output voltage during the output time period is limited to the offset voltage VOS alone. As a result, it can be expected that the voltage is rapidly stabilized during the output time period.

The offset cancellation circuit 3 is characterized in that:
the voltage, in which the offset voltage is included though, can be outputted during the substantially entire time period of 1 line; and
according to the voltage characteristics described above, the offset cancellation circuit 3 can be driven in a state where the output voltage is set at up to around a predetermined voltage (at best, at up to around the predetermined voltage±offset voltage) during the offset storage time period even in the case where a load of the operational amplifier OP2 is very heavy and a time constant is thereby large, and offset cancellation circuit 3 can be driven only for the length of time corresponding to the offset portion during the output time period.

According to the offset cancellation circuit 3 thus characterized, an accurate voltage drive in which the offset voltage is cancelled and high-rate processing can be both realized.

Preferred Embodiment 3

Figure 3:
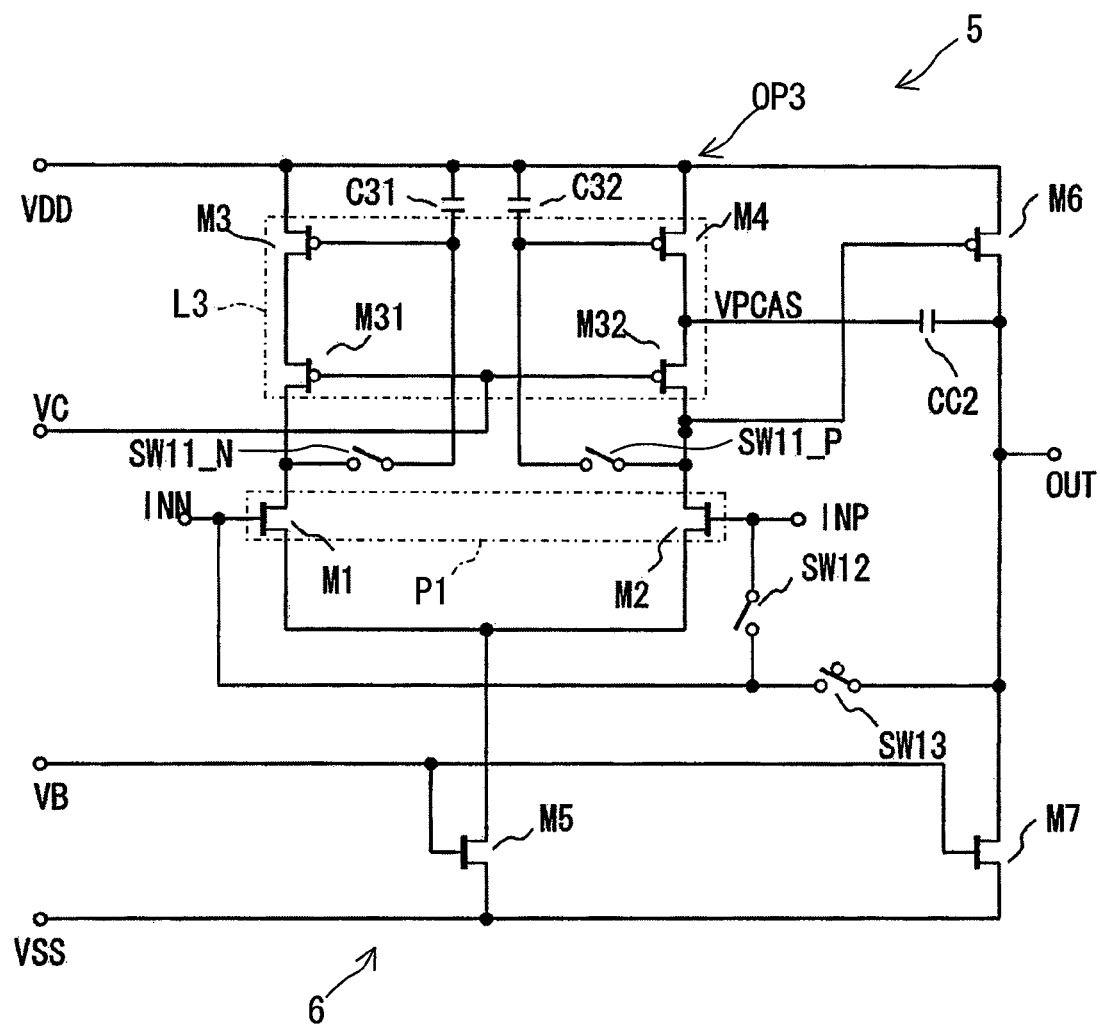
FIG. 3 is a circuit diagram illustrating a constitution of an offset cancellation circuit according to a preferred embodiment 3 of the present invention.

FIG. 3 is a circuit diagram illustrating a constitution of an offset cancellation circuit 5 according to a preferred embodiment 3 of the present invention. The offset cancellation circuit 5 is operated based on the control timing illustrated in FIG. 9. In the present preferred embodiment, a third active load L3 is provided in place of the first active load L1 in the constitution according to the preferred embodiment 1. In the preferred embodiment 3, these structural components constitute an operational amplifier OP3 and a differential amplifier 6. In FIG. 3, the same structural components as those described referring to FIGS. 1 and 2 are shown with the same reference symbols attached thereto and will not be described in detail.

The third active load L3 comprises transistors M3 and M4 and transistors M31 and M32. The transistors M3 and M4 are configured as in the case with the transistors M3 and M4 of the first active load L1 according to the preferred embodiment 1. The transistor M31 is provided between transistors M1, one transistor of the first differential pair P1, and the transistor M3. The transistor M32 is provided between the transistor M2, the other transistor of the first differential pair P1, and the transistor M4. The transistors M31 and M32 are controlled based on a bias voltage VC. More specifically, the transistors M3 and M31 respectively have, what is called, a low-voltage cascode configuration, and the transistors M4 and M32 also respectively have the low-voltage cascode configuration.

A capacitance C31 is a capacitance in which charges of a gate potential of the transistor M3 are retained. A capacitance C32 is a capacitance in which charges of a gate potential of the transistor M4 are retained. A switch SW11_N controls a connection between a gate of the transistor M3 and a drain of the transistor M31. A switch SW11_P controls a connection between a gate of the transistor M4 and a drain of the transistor M32. A capacitance CC2 is a phase compensation capacitance of the operational amplifier OP3. The switches SW11_N and SW11_P are opened and closed based on the control signal SWA illustrated in FIG. 9 as in the case of the switch SW12. These switches are in the conducting state when the control signal SWA is in the H state, while they are in the non-conducting state when the control signal SWA is in the L state. The switch SW13 is opened and closed based on the control signal SWB illustrated in FIG. 9. The switch S13 is in the conducting state when the control signal SWB is in the H state, while it is in the non-conducting state when the control signal SWB is in the L state.

Next, an operation of the offset cancellation circuit 5 thus constituted is described referring to the timing chart illustrated in FIG. 9.

Time Period Up To Time Point t0_1

This time period is the non-display time period. During this time period, the input INP (input voltage to the transistor M2) is in the HI-Z state, and the control signal SWA and SWB are ignorable.

Time Point t0_1

At this time point, the non-display time period shifts to the display time period. When this time point arrives, the voltage VD1 is applied to the input INP.

Time Point t1_1

This time point is a time point when the offset storage time period arrives in the display time period. At this time point, the control signal SWA shifts to the H state, while the control signal SWB shifts to the L state. At this time point, the switches SW11_N, SW11_P and SW12 are in the conducting state, while the switch SW13 is in the non-conducting state.

As is the case with the preferred embodiment 1, an operation in the case where the transistors M1, M3 and M4 are manufactured so as to have such characteristics that satisfy their design values, and the transistor M2 is manufactured in such a way that its performance is higher than its design value (or its threshold value VT is low) due to mismatch; thus the random offset voltage is generated, is described below.

Time Point t2_1

At this time point, the offset storage time period ends, and the non-overlap time period starts. When this time point arrives, the switches SW11_N and SW11_P are in the non-conducting state, and the capacitances C31 and C32 are ready to store the charges. A time period from the time point t2_1 through a time point t3_1 is the non-overlap time period. An operation during the non-overlap time period is basically as described in the preferred embodiment 1.

Time Point t3_1

At this time point, the non-overlap time period ends, and the output time period starts. In the output time period at and after this time point (time period from the time point t3_1 through a time point t4_1), the transistors M3 and M4 are operated at a suitable operation point appropriate to the input voltage VD1 based on the voltages of the capacitances C11 and C12 in which the mismatch portions of the transistors M1-M4 are stored. As a result, the offset voltage is reduced. During the output time period, the offset cancellation circuit unfailingly outputs the input voltage VD1.

Time Period From Time Point t3_1 Through Time Point t4_1

This time period is the output time period. During this time period, the input voltage VD1 can be reliably outputted.

Time Point t4_1

At this time point, the switch SW13 is in the non-conducting state, and the output time period ends.

Time Point t0_2

At this time point, the operation proceeds to the offset cancellation in the next line.

When the operation described so far is repeatedly executed, the output voltage, in which the offset voltage is reduced, can be outputted with respect to input voltage of each line.

The offset cancellation circuit 5 is characterized in that:
the current and voltage of mismatch portions are stored in the capacitances C31 and C32 connected to the gates of the transistors M3 and M4 (the storage of the current/voltage in the capacitances C31 and C32 is the same as that of the offset cancellation circuit 1 described in the preferred embodiment 1).

The drain voltage of the transistor M3 is determined by the current flowing in the transistor M31 and the bias voltage VC, and the drain voltage of the transistor M4 is determined by the current flowing in the transistor M32 and the bias voltage VC.

Because the voltages are thus determined, the drain voltages of the transistors M3 and M4 are substantially equal to the voltages charged in the capacitances C31 and C32 in the offset storage time period (time period from the time point t1_1 through t1_2).

According to the voltage characteristic (equal voltages) described above, the current supplied from the transistor M3 to the transistor M4 and the current supplied from the transistor M4 to the transistor M2 can be made more accurate compared with those of a structure wherein a cascode configuration is not provided.

Preferred Embodiment 4

FIG. 4 is a circuit diagram illustrating a constitution of an offset cancellation circuit 7 according to a preferred embodiment 4 of the present invention. The offset cancellation circuit 7 is basically constituted as described in the preferred embodiment 3, and is operated based on the control timing illustrated in FIG. 9. However, the offset cancellation circuit 7 further comprises switches SW41-SW45. The switch SW41 controls a connection between the gate of the transistor M6 constituting the output unit and a power supply VDD. The switch SW42 controls a connection between the output units of the first differential pair P1 and the third active load L3 and the gate of the transistor M6. The switch 43 controls a connection between the output unit of the operational amplifier OP3 and the non-inversion input unit of the first differential pair P1. The switch SW44 controls a connection between the gate of the transistor M7 constituting the output unit of the operational amplifier OP3 and the bias voltage VB. The switch SW45 controls a connection between the gate of the transistor M7 and a power supply VSS. The switches SW41, SW43 and SW45 are opened and closed based on the control signal SWA illustrated in FIG. 9 as in the case of the switches SW11_N, SW11_P and SW12. These switches are in the conducting state when the control signal SWA shifts to the H state, while they are in the non-conducting state when the control signal SWA shifts to the L state. The switches SW42 and SW44 are opened and closed based on the control signal SWB illustrated in FIG. 9 as in the case of the switch SW13. These switches are in the conducting state when the control signal SWB shifts to the H state, while they are in the non-conducting state when the control signal SWB shifts to the L state. The operational amplifier OP3 is configured as a voltage follower. The transistor M6 is a drive transistor on the side of a high power supply of the output unit of the operational amplifier OP3 (high-side transistor), while the transistor M7 is a drive transistor on the side of a low power supply of the output unit of the operational amplifier OP3 (low-side transistor).

Next, an operation of the offset cancellation circuit 7 thus constituted is described referring to the timing chart illustrated in FIG. 9.

Time Period Up To Time Point t0_1

This time period is the non-display time period. During this time period, the input INP (input voltage to the transistor M2) is in the HI-Z state, and the control signals SWA and SWB are ignorable.

Time Point t1_1

At this time point, the non-display time period shifts to the display time period. When this time point arrives, the voltage VD1 is applied to the input INP.

Time Point t0_1

This time point is a time point when the offset storage time period arrives in the display time period. When this time point arrives, the control signal SWA shifts to the H state, while the control signal SWB shifts to the L state. At this time point, the switches SW41, SW43, SW45, SW11_N, SW11_P and SW12 are in the conducting, while the switch SW13 in the non-conducting state.

In a manner similar to the preferred embodiment 1, an operation in the case where the transistors M1, M3 and M4 are manufactured so as to have such characteristics that satisfy their design values, and the transistor M2 is manufactured in such a way that its performance is higher than its design value (or its threshold value VT is low) due to mismatch; thus the random offset voltage is generated, is described below.

At the time point t1_1, the switches are controlled as follows in the offset cancellation circuit 7:

The switch SW42 shifts to the non-conducting state, and the gate of the transistor M6 and the output unit of the differential amplifier 6 are thereby disconnected from each other;

The switch SW41 shifts to the conducting state, and the voltage of the power supply VDD is thereby supplied to the gate of the transistor M6.

The switch S44 shifts to the non-conducting state, and the gate of the transistor M7 and the bias voltage VB are thereby disconnected from each other;

The switch SW45 shifts to the conducting state, and the voltage of the power supply VSS is thereby supplied to the gate of the transistor M7; and The switch SW43 shifts to the conducting state, and the output OUT of the operational amplifier OP3 and the non-inversion input unit of the differential amplifier 6 are thereby connected to each other.

Since the respective switches are thus controlled, the current output functions of the transistors M6 and M7 (constituting the output unit of the operational amplifier OP3) are halted at the time point t1_1, and the output OUT of the operational amplifier OP3 is accordingly in the HI-Z state. Further, the output OUT of the operational amplifier OP3 which halted its output function is connected to the non-inversion input unit of the differential amplifier 6. In brief, the voltage of the output OUT equals the voltage VD1. The voltage VD1 is a targeted value of the output voltage in the output OUT of the operational amplifier OP3.

Time Point t2_1

At this time point, the offset storage time period ends, and the non-overlap time period starts. When this time point arrives, the switches SW11_N and SW11_P are in the non-conducting state, and the capacitances C31 and C32 are ready to store the charges. At the same time, the switches SW41, SW43 and SW45 are in the non-conducting state. The time period from the time point t2_1 through the time point t3_1 is the non-overlap time period. An operation during the non-overlap time period is basically the same as described in the preferred embodiment 1.

Time Point t3_1

At this time point, the non-overlap time period ends, and the output time period starts. In the output time period at and after this time point (time period from the time point t3_1 through the time point t4_1), the switches SW42, SW44 and SW13 are in the conducting state. In the output time period at and after the time period t3_1, the transistors M3 and M4 are operated at a suitable operation point appropriate to the input voltage VD1 based on the voltages of the capacitances C11 and C12 in which the mismatch portions of the transistors M1-M4 are stored. As a result, the offset voltage is reduced. During the output time period, the operational amplifier OP3 unfailingly outputs the input voltage VD1.

The offset cancellation circuit 7 is characterized as follows:

The drain voltage of the transistor M3 is determined by the current flowing in the transistor M31 and the bias voltage VC, while the drain voltage of the transistor M4 is determined by the current flowing in the transistor M32 and the bias voltage VC;

Because the voltages are thus determined, the drain voltages of the transistors M3 and M4 are substantially equal to the voltages charged in the capacitances C31 and C32 during the offset storage time period (time period from the time point t1_1 through the time point t1_2); and As a result of the voltage characteristic (equal voltages), the current supplied from the transistor M3 to the transistor M1 and the current supplied from the transistor M4 to the transistor M2 can be supplied more accurately than in the constitution wherein the cascode configuration is not provided.

A further characteristic of the offset cancellation circuit 7 is voltages at two nodes to which the phase compensation capacitance CC1 is connected. A voltage at a node VPCAS on the side of the differential amplifier 6 hardly changes because the voltage is determined by the currant flowing in the transistor M32 and the bias voltage VC. Furthermore, the voltage VD1 is outputted from the output OUT of the operational amplifier OP3 during the offset storage time period (time period from the time point t1_1 through the time point t2_1) as in the case of the input voltage, while the input voltage VD1, which was subjected to offset cancellation, is outputted therefrom during the output time period (time period up to the time point t3_1). In other words, very little variation occurs in the voltages at both ends of the phase compensation capacitance CC1 during the transition from the offset storage time period to the output time period. Therefore, the potential difference between both ends of the phase compensation capacitance CC1 is very small, which curtails an amount of time necessary for charging and discharging the phase compensation capacitance CC1. As a result, an internal through rate is remarkably increased, and a higher processing rate can be thereby achieved. As thus far described, the input voltage VD1 can be reliably outputted during the output time period (time period from the time point t3_1 through the time point t4_1).

The operation is described below referring to the control operations at the respective time points again.

Time Point t4_1

At this time point, the switch SW13 shifts to the non-conducting state, and the output time period ends.

Time Point t0_2

At this time point, the operation proceeds to the offset cancellation for the next line.

The operation described so far is repeatedly executed. As a result, the output voltage, in which the offset voltage is controlled, can be outputted with respect to input voltage of each line.

Preferred Embodiment 5

Figure 5:
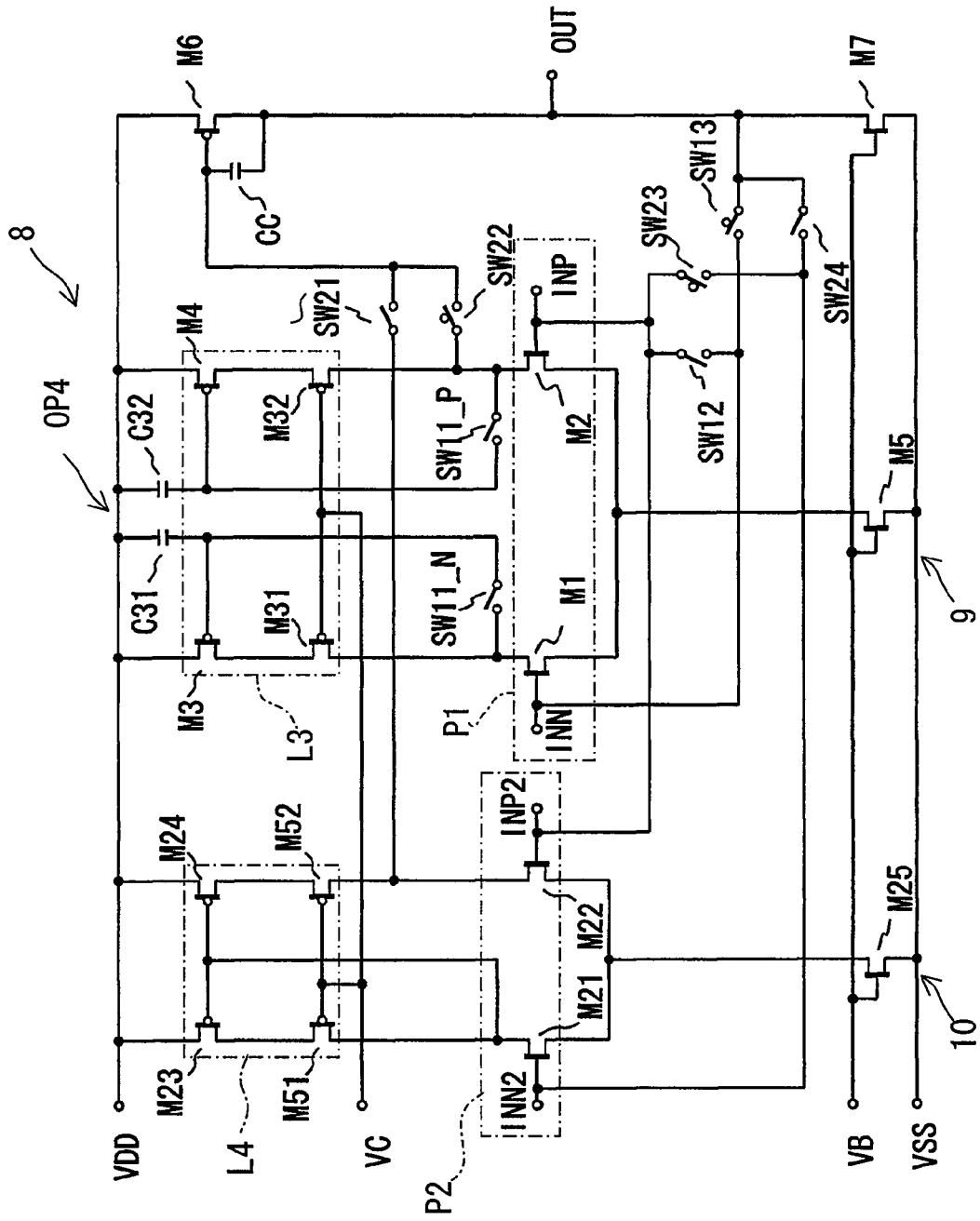
FIG. 5 is a circuit diagram illustrating a constitution of an offset cancellation circuit according to a preferred embodiment 5 of the present invention.

FIG. 5 is a circuit diagram illustrating a constitution of an offset cancellation circuit 8 according to a preferred embodiment 5 of the present invention. The offset cancellation circuit 8 is operated based on the control timing illustrated in FIG. 10. In the present preferred embodiment, a third active load L3 is provided in place of the first active load L1, and a fourth active load L4 is provided in place of the second active load L2 in the constitution according to the preferred embodiment 2. In FIG. 5, the same structural components as those described referring to FIGS. 1 and 2 are shown with the same reference symbols attached thereto and will not be described in detail.

The third active load L3 comprises transistors M3 and M4 and transistors M31 and M32. The transistors M3 and M4 are the same as the transistors M3 and M4 provided in the first active load L1 according to the preferred embodiment 1. The transistor M31 is provided between the transistor M1, one transistor of the first differential pair P1, and the transistor M3. The transistor M32 is provided between the transistor M2, the other transistor of the first differential pair P1, and the transistor M4. The transistors M31 and M32 are controlled based on the bias voltage VC. The transistors M3 and M31 have, what is called, a low-voltage cascode configuration, and the transistors M4 and M32 also have a low-voltage cascode configuration.

The fourth active load L4 comprises transistors M23 and M24 and transistors M51 and M52. The transistors M23 and M24 are the same as the transistors M23 and M24 provided in the second active load L2 according to the preferred embodiment 2. The transistor M51 is provided between the transistor M21, one transistor of the second differential pair P2, and the transistor M23. The transistor M52 is provided between the transistor M22, the other transistor of the second differential pair P2, and the transistor M24. The transistors M51 and M51 are controlled based on the bias voltage VC. The transistor M23 and M51 have, what is called, a low-voltage cascode configuration, and in a like manner, the transistors M24 and M52 also have a low-voltage cascode configuration. In the preferred embodiment 5, the transistors M1-M5, M31 and M32 constitute a differential amplifier 9, and the transistors M21-M25, M51 and M52 constitute a differential amplifier 10 for offset cancellation. These structural components constitute an operational amplifier OP4.

An operation of the offset cancellation circuit 8 thus constituted is described referring to the timing chart illustrated in FIG. 10.

Time Period Up To Time Point t0_1

This time period is the non-display time period, during which the input INP (input voltage to the transistor M2) is in the HI-Z state, and the control signals SWA and SWB are ignorable.

Time Point t0_1

At this time point, the non-display time period shifts to the display period. When this time point arrives, the voltage VD1 is applied to the input INP.

Time Point t1_1

This time point is a time point when the offset storage time period arrives in the display period. When this time point arrives, the control signal SWA shifts to the H state, while the control signal SWB shifts to the L state. At this time point, the switches SW11_N, SW11_P, SW12, SW21 and SW24 are in the conducting state, while the switches SW13, SW22 and SW23 are in the non-conducting state.

As is the case with the preferred embodiment 1, an operation in the case where the transistors M1, M3 and M4 are manufactured so as to have such characteristics that satisfy their design values, and the transistor M2 is manufactured in such a way that its performance is higher than its design value (or its threshold value VT is low) due to mismatch; thus the random offset voltage is generated, is described below.

The offset cancellation circuit 8 is characterized as follows:
The current and voltage of mismatch portions are stored in the capacitances C31 and C32 connected to the gates of the transistors M3 and M4 (the storage of the current and voltage in the capacitances C31 and C32 is as described in the offset cancellation circuit 1 according to the preferred embodiment 1).

The input voltage VD1 is applied to the non-inversion input unit of the differential amplifier 10 for offset cancellation, the drain of the transistor M6 is connected to the inversion input unit of the differential amplifier 10 for offset cancellation, and the output voltage of the differential amplifier 10 for offset cancellation is applied to the gate of the transistor M6. As a result, the voltage VD1+VOS, in which the offset voltage is added to the input voltage, can be outputted from the operational amplifier OP4. In other words, a voltage close to the input voltage VD1, though the offset voltage is included therein, can be outputted.

Based on the characteristics described so far, the operation at each time point and during time period is described below.

Time Point t2_1

At this time point, the offset storage time period ends, and the non-overlap time period starts. When this time point arrives, the switches SW11_N and SW11_P are in the non-conducting state, and the capacitances C11 and C12 are ready to store the charges. The time period from the time point t2_1 through the time point t3_1 is the non-overlap time period. The operation during the non-overlap time period is basically the same as that of the preferred embodiment 1.

Time Point t3_1

At this time point, the non-overlap time period ends, and the output time period starts. In the output time period at and after this time point (time period from the time point t3_1 through the time point t4_1), the switches SW13, SW22 and SW23 are in the conducting state. In the output time period, the transistors M3 and M4 are operated at a suitable operation point appropriate to the input voltage VD1 based on the voltages of the capacitances C11 and C12 in which the mismatch portions of the transistors M1-M4 are stored. As a result, the offset voltage is reduced.

Time Period From Time Point t3_1 Through Time Point t4_1

This time period is the output time period. In the preferred embodiment 5, the input voltage VD1 can be surely outputted during the output period.

Time Point t4_1

At this time point, the switch SW13 is in the non-conducting state.

Time Point t0_2

At this time point, the operation proceeds to the offset cancellation in the next line.

The operation described so far is repeatedly executed. As a result, the output voltage, in which the offset voltage is controlled with respect to the input voltage of each line, can be outputted.

In the offset cancellation circuit 8, the output voltage is VD1+VOS during a time period up to the output time period (period up to the time point t3_1, and also corresponding to the display time period+offset storage time period+non-overlap time period). Therefore, the variation of the output voltage during the output time period is limited to the offset voltage VOS alone. As a result, it can be expected that the voltage is rapidly stabilized during the output time period.

Preferred Embodiment 6

Figure 6:
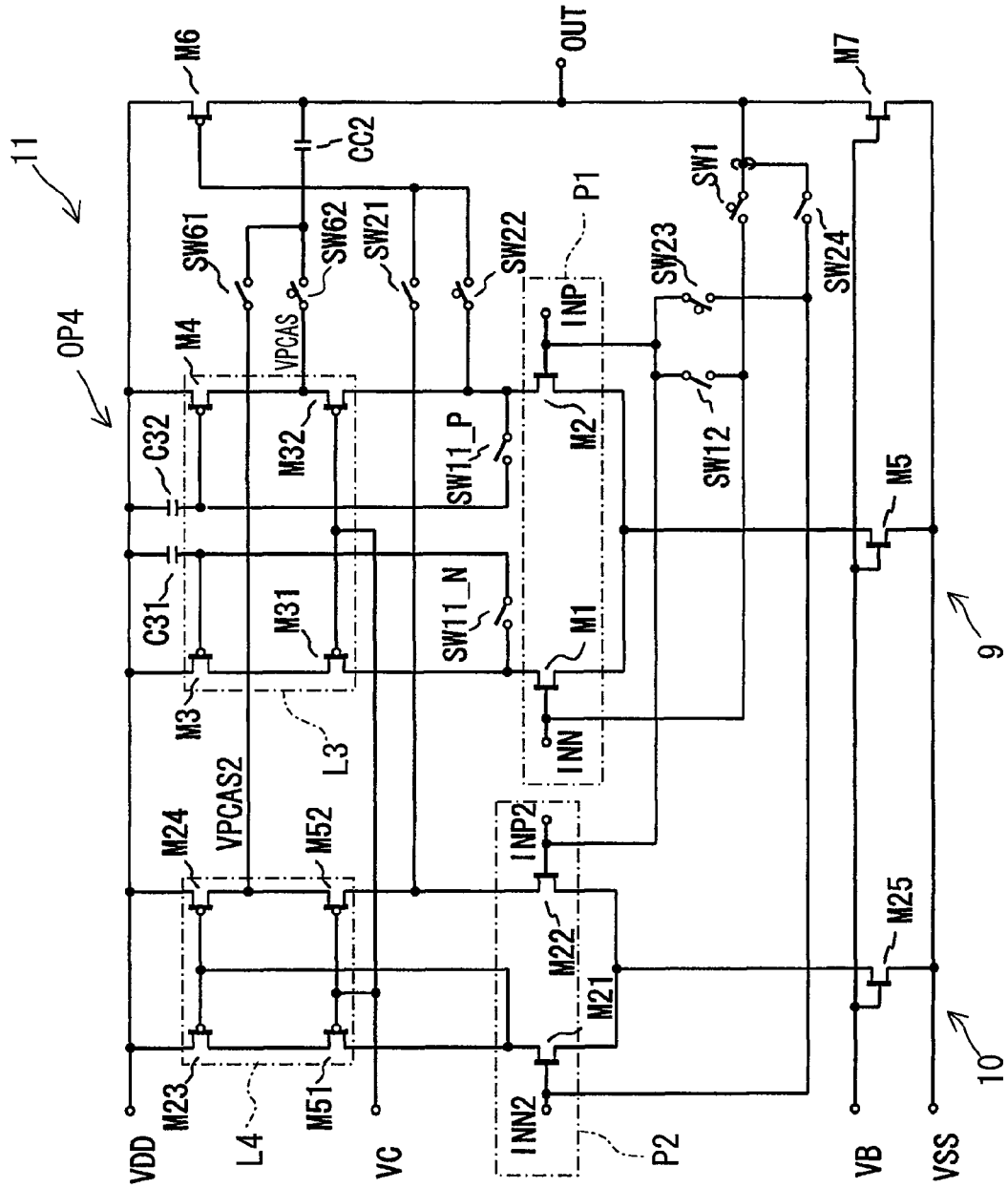
FIG. 6 is a circuit diagram illustrating a constitution of an offset cancellation circuit according to a preferred embodiment 6 of the present invention.

FIG. 6 is a circuit diagram illustrating a constitution of an offset cancellation circuit 11 according to a preferred embodiment 6 of the present invention. The offset cancellation circuit 11 is operated based on the control timing illustrated in FIG. 10. The offset cancellation circuit 11 is basically the same as described in the preferred embodiment 5. In FIG. 6, the same structural components as those described referring to FIG. 5 are shown with the same reference symbols attached thereto and will not be described in detail.

The capacitance CC2 is a phase compensation capacitance of the operational amplifier OP4. A switch SW61 controls a connection between the phase compensation capacitance CC2 and a node VPCAS2 in a cascode stage of an output-side active load of a differential amplifier 10 for offset cancellation. A switch SW62 controls a connection between the phase compensation capacitance CC2 and a node VPCAS in a cascode stage of an output-side active load of a differential amplifier 10 for offset cancellation. The switch SW61 is opened and closed based on the control signal SWA as is the case with the switches SW11_N, SW11_P, SW21, SW24 and SW12. The switch S61 is in the conducting state when the control signal SWA is in the H state, while it is in the non-conducting state when the control signal SWA is in the L state. The switch SW62 is opened and closed based on the control signal SWB as in the case of the switches SW22, SW23 and SW13. The switch S62 is in the conducting state when the control signal SWB is in the H state, while it is in the non-conducting state when the control signal SWA is in the L state.

An operation of the offset cancellation circuit 11 thus constituted is described referring to the timing chart illustrated in FIG. 10.

Time Period Up To Time Point t_1

This time period is the non-display time period, during which the input INP (input voltage to the transistor M2) is in the HI-Z state, and the control signals SWA and SWB are ignorable.

Time Point t1_1

This time point is a time point when the offset storage time period arrives in the display period. When this time point arrives, the voltage VD1 is applied to the input INP, and the control signal SWA shifts to the H state, while the control signal SWB shifts to the L state. At this time point, the switches SW11_N, SW11_P, SW12, SW21 and SW24 are in the conducting state, while the switches SW13, SW22 and SW23 are in the non-conducting state.

As is the case with the preferred embodiment 1, an operation in the case where the transistors M1, M3 and M4 are manufactured so as to have such characteristics that satisfy their design values, and the transistor M2 is manufactured in such a way that its performance is higher than its design value (or its threshold value VT is low) due to mismatch; thus the random offset voltage is generated, is described below.

Time Point t2_1

At this time point, the offset storage time period ends, and the non-overlap time period starts. When this time point arrives, the switches SW11_N and SW11_P are in the non-conducting state, and the capacitances C11 and C12 are ready to store the charges. The time period from the time point t2_1 through the time point t3_1 is the non-overlap time period.

Time Point t3_1

At this time point, the non-overlap time period ends, and the output time period starts. During the output time period at and after this time point (time period from the time point t3_1 through the time point t4_1), the switches SW13, SW22 and SW23 are in the conducting state. During the output time period at and after this time point (time period from the time point t3_1 through the time point t4_1), the transistors M3 and M4 are operated at a suitable operation point appropriate to the input voltage VD1 based on the voltage of the capacitances C11 and C12 in which mismatch portions of the transistors M1-M4 are stored. As a result, the offset voltage is reduced.

Time Period From Time Point t3_1 Through Time Point t4_1

This time period is the output time period. In the preferred embodiment 6, the input voltage VD1 can be surely outputted during the output time period.

Time Point t4_1

At this time point, the switch SW13 is in the non-conducting state.

Time Point t0_2

At this time point, the operation proceeds to the offset cancellation in the next line.

The operation described so far is repeatedly executed. Accordingly, the output voltage, in which the offset is reduced, can be outputted with respect to input voltage of each line.

The offset cancellation circuit 11 is characterized as follows:

The current and voltage of mismatch portion are stored in the capacitances C31 and C32 connected to the gates of the transistors M3 and M4;

The active loads L3 and L4 provided in the differential amplifier 9 and the differential amplifier 10 for offset cancellation have a low-voltage cascode configuration. The drain voltage of the transistor M3 is determined by the current flowing in the transistor M31 and the bias voltage VC, while the drain voltage of the transistor M4 is determined by the current flowing in the transistor M32 and the bias voltage VC;

The input voltage VD1 is applied to the non-inversion input unit of the differential amplifier 10 for offset cancellation, the drain of the transistor M6 is connected to the inversion input unit of the differential amplifier 10 for offset cancellation, and the output voltage of the differential amplifier 10 for offset cancellation is applied to the gate of the transistor M6. As a result, the voltage VD1+VOS, in which the offset voltage is added to the input voltage, can be outputted from the operational amplifier OP4. In brief, a voltage close to the input voltage VD1, though the offset voltage is included therein, can be outputted.

The active load of the differential amplifier 10 for offset cancellation also has a low-voltage cascode configuration. Therefore, the drain voltage of the transistor M3 is determined by the current flowing in the transistor M51 and the bias voltage VC, while the drain voltage of the transistor M24 is determined by the current flowing in the transistor M52 and the bias voltage VC.

When the transistors M3, M4, M23 and M24, and the transistors M31, M32, M51 and M52 are respectively designed to have equal sizes, the drain voltage of the transistor M24 (voltage of the node VPCAS2) and the drain voltage of the transistor M4 (voltage of the node VPCAS) can be substantially equal to each other.

The voltage of the node VPCAS is determined by the current flowing in the transistor M32 and the bias voltage VC, but the voltage of the node VPCAS in the period during which the capacitances C31 and C32 are charged (offset storage time period) and the voltage of the node VPCAS in the output time period can be made substantially equal to each other with very little difference therebetween. Accordingly, the current supplied from the transistor M3 to the transistor M1 and the current supplied from the transistor M4 to the transistor M2 can be controlled as follows. These currents can be supplied, as the currents in which the offset voltage is stored, more accurately in comparison with similar currents in an offset cancellation circuit wherein the cascode configuration is not provided.

During the period up to the time point t3_1 (non-display time period+offset storage time period+non-overlap time period), the output voltage is VD1+VOS. Therefore, the variation of the output voltage during the output time period is limited to the offset voltage VOS alone.

The phase compensation capacitance CC2 is connected to between the output-side cascode stages of the differential amplifier 9 and the differential amplifier 10 for offset cancellation, and the output node OUT of the operational amplifier OP4. With regard to voltages at each end of the capacitance CC2, the variation of the voltage at the output node OUT is limited to the voltage VOS alone between VD1+VOS and VD1 as described earlier. Further, the other node is switched from the node VPCAS2 to the node VPCAS according to the changeover of the switch; however, there is very little voltage variation as a result of the switch control as descried earlier. Therefore, the voltages at both ends of the capacitance CC2 hardly change, and the recharge time for the phase compensation capacitance CC2 can be very short. As a result, a speedy operation can be expected.

Preferred Embodiment 7

Figure 7:
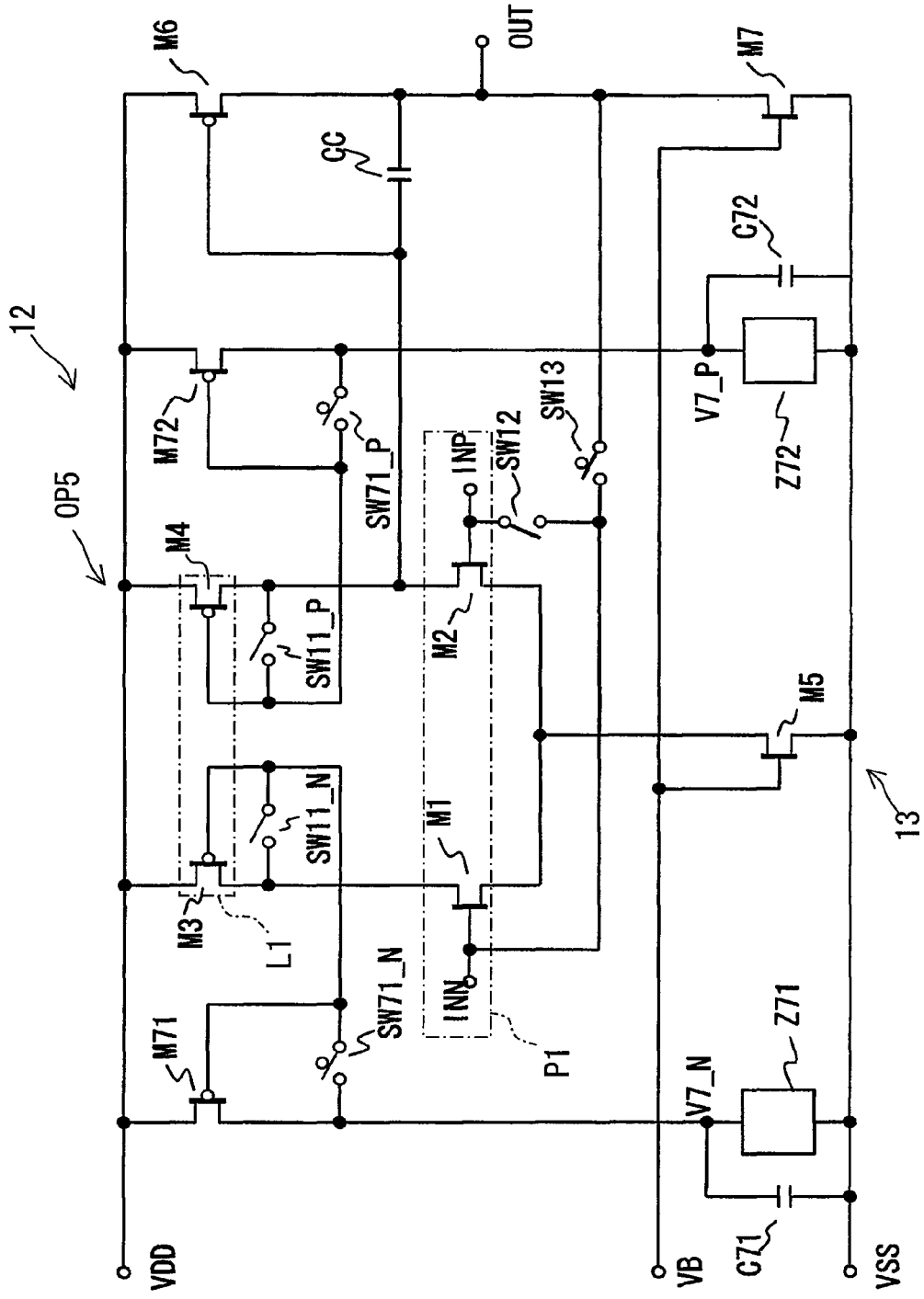
FIG. 7 is a circuit diagram illustrating a constitution of an offset cancellation circuit according to a preferred embodiment 7 of the present invention.
Figure 8A:
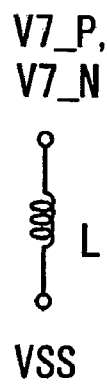
FIGS. 8A-8D are circuit diagrams illustrating specific examples of structural components of an impedance unit according to the preferred embodiment 7.
Figure 8B:
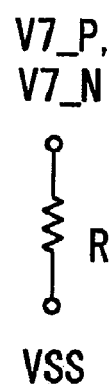
Figure 8C:
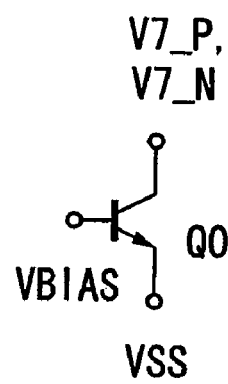
Figure 8D:
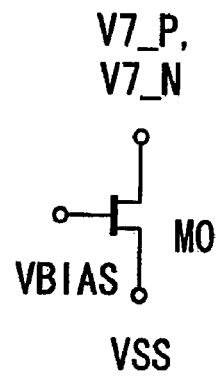

FIG. 7 is a circuit diagram illustrating a constitution of an offset cancellation circuit 12 according to a preferred embodiment 7 of the present invention. The offset cancellation circuit 12 is operated based on the control timing illustrated in FIG. 9. The offset cancellation circuit 12 comprises an operational amplifier OP5 and a differential amplifier 13. The constitutions of the operational amplifier OP5 and the differential amplifier 13 are basically the same as those of the operational amplifier OP1 and the differential amplifier 2 according to the preferred embodiment 1, but different in the following points. In the operational amplifier OP5 and the differential amplifier 13, impedance units Z71 and Z72 and capacitances C71 and C72 are provided in place of the capacitances C11 and C12. The offset cancellation circuit 12 further comprises transistors M71 and M72, capacitances C71 and C72, and switches SW71_N and SW71_P.

The transistor M71 comprises a source and a gate which are shared by the transistor M3, and a drain thereof is connected to the ground via the impedance unit Z71. The capacitance C71 is connected in parallel to the impedance unit Z71. The transistor M72 comprises a source and a gate which are shared by the transistor M4, and a drain thereof is connected to the ground via the impedance unit Z72. The capacitance C72 is connected in parallel to the impedance unit Z72.

The switch SW71_N controls a connection between the gate and the drain of the transistor M71, while the switch SW71_P controls a connection between the gate and the drain of the transistor M72. The switches SW11_N, SW11_P and SW12 are opened and closed based on the control signal SWA. These switches are in the conducting state when the control signal SWA is in the H state, while they are in the non-conducting state when the control signal SWA is in the L state. The switches SW71_N and SW71_P are opened and closed based on the control signal SWB as in the case of the switch SW13. These switches are in the conducting state when the control signal SWB is in the H state, and while they are in the non-conducting state when the control signal SWB is in the L state.

Next, an operation of the offset cancellation circuit 12 thus constituted is described referring to the timing chart illustrated in FIG. 9.

Time Period Up to the Time Point t0_1

This time period is the non-display period. During this time period, the input INP (input voltage to the transistor M2) is in HI-Z state, and the controls signals SWA and SWB are ignorable.

Time Point t0_1

At this time point, the non-display time period shifts to the display time period. When this time point arrives, the voltage VD1 is applied to the input INP.

Time Point t1_1

At this time point, the offset storage time period arrives in the display time period. When this time point arrives, the control signal SWA shifts to the H state, while the control signal SWB shifts to the L state. At this time point, the switches SW11_N, SW11_P and SW12 are in the conducting state, while the switches SW13, SW71_N and SW71_P are in the non-conducting state.

At this time, the gate and the drain of the transistor M3 are connected to each other, and the gate and drain are further connected to the gate of the transistor M71. Accordingly, the transistor M3 and the transistor M71 function as a current mirror circuit. Thus, the transistor M71 supplies a current proportional to the current flowing in the transistor M1 (constituting the first differential pair P1) to the impedance unit Z71. The impedance unit Z71 converts the current supplied from the transistor M71 into a voltage. Then, the voltage responsive to the current flowing in the transistor M1 is generated at a node V3_N, and the capacitance 71 is charged with the generated voltage.

At this time, the gate and the drain of the transistor M4 are also connected to each other, and the gate and drain are further connected to the gate of the transistor M72. Accordingly, the transistor M4 and the transistor M72 function as a current mirror circuit. Thus, the transistor M72 supplies a current proportional to the current flowing in the transistor M2 (constituting the first differential pair P1) to the impedance unit Z72. The impedance unit Z72 converts the current supplied from the transistor M72 into a voltage. Then, the voltage responsive to the current flowing in the transistor M2 is generated at a node V3_P, and the capacitance 72 is charged with the generated voltage.

In the manner as the preferred embodiment 1, an operation in the case where the transistors M1, M3 and M4 are manufactured so as to have such characteristics that satisfy their design values, and the transistor M2 is manufactured in such a way that its performance is higher than its design value (or its threshold value VT is low) due to mismatch; thus the random offset voltage is generated, is described below.

In the case where mismatch occurs, the offset cancellation circuit 12 stores the current and voltage of the mismatch portions in the capacitances C71 and C72 respectively connected in parallel to the impedance unit Z71 and the impedance unit Z72.

Here, description is made to a circuit operation for controlling the charging time of the capacitances C71 and C72. When the sizes of the transistors M3 and M4 constituting the first active load L1 and the currents to be supplied are changed in order to adjust the offset cancellation time period, a gain and a frequency responsiveness of the operational amplifier OP5 are thereby affected. Therefore, in the case where the responsiveness of the operational amplifier OP5 is properly set with the drive of the display device or the like in view, the offset voltage cannot be cancelled without sacrificing the responsiveness of the operational amplifier OP5 or the like. Further, when the capacitance values of the capacitances C71 and C72 are decreased so that the charging time is reduced in order to shorten the offset cancellation time period, the charges corresponding to the offset voltage are suitably stored in the capacitances C71 and C72 under the influences of charge injection and clock field-through of the switches. As a result, the charges supplied to the capacitances C71 and C72 vary, which causes a relative deviation in the charge amounts of the capacitances C71 and C72. As a result, it is difficult to apply an accurate voltage.

In the case where the offset cancellation time period needs to be shortened in the offset cancellation circuit 12, drive performance of the transistor M72 is set to be larger than that of the transistor M4, and drive performance of the transistor M71 is set to be larger than that of the transistor M3, for example, fivefold. Accordingly, the currents flowing in the transistor M71 and M72 are also increased fivefold, and the charging time of the capacitances C71 and C72 can be thereby reduced to $\frac{1}{5}$. As a result, the offset cancellation time period can be reduced to $\frac{1}{5}$. When the sizes of the capacitances C71 and C72 are increased fivefold so that the deviations in the charges in the capacitances C71 and C72 described earlier can be made relatively small, the offset voltage can be more effectively removed. In this case, the length of the time period for storing the offset voltage remains unchanged because the currents flowing in the transistors M71 and M72 are also increased fivefold.

In the offset cancellation circuit 12, the drive performance of the transistors M71 and M72 are set high with reference to the drive performance of the transistors M3 and M4 (are set at a predetermined drive performance ratio which is not less than 1). As a result, the various characteristics of the operational amplifier OP5 such as current consumption, an offset control amount, and a required area for mounting a chip can be set to such values that are most suitable when applied to a display device and a drive circuit.

Below is given a further description referring to the control operation at each time point again.

Time Point t2_1

At this time point, the offset storage time period ends, and the non-overlap time period starts. When this time point arrives, the switches SW11_N and SW11_P are in the non-conducting state, and the gate-drain connections in the transistors M3 and M4 are released.

Time Point t3_1

At this time point, the non-overlap time period ends, and the output time period stars. When this time point arrives, the switches SW13, SW71_N and SW71_P are in the conducting state. Further, at this time point, the gate and the drain of the transistor M71 are connected to each other, and the gate and drain are further connected to the gate of the transistor M3. Then, the transistor M71 and the transistor M3 function as a current mirror circuit. Accordingly, the current responsive to the charges stored in the capacitance C71 flows through the transistor M71, while the current in compliance with the charges stored in the capacitance C71 flows from the transistor M3. Similarly, the gate and the drain of the transistor M72 are connected to each other, and the gate and drain are further connected to the gate of the transistor M4. Then, the transistor M72 and the transistor M4 function as a current mirror circuit. Accordingly, the current responsive to the charges stored in the capacitance C72 flows through the transistor M72, while the current responsive to the charges stored in the capacitance C72 flows through the transistor M4.

As described earlier, the mismatch portions of the transistors M1-M4 are stored in the charges retained in the capacitances C71 and C72. Therefore, the transistors M3 and M4 are operated at a suitable operation point appropriate to the input voltage VD1, as a result of which the input voltage VD1 is outputted with the offset voltage reduced. The output time period is a period from the time point t3_1 through the time point t4_1. During the output time period, the input voltage VD1 is unfailingly outputted.

Time Point t4_1

At this time point, the switch SW13 is in the non-conducting state, and the output time period ends.

Time Point t0_2

At this time point, the operation proceeds to the offset cancellation in the next line.

The operation described so far is repeatedly executed, and then, the output voltage, in which the offset voltage is controlled, can be outputted.

FIGS. 8A-8D are illustrations of specific examples of the impedance units Z71 and Z72. An inductor element (FIG. 8A), a resistance element (FIG. 8B), a bipolar transistor (FIG. 8C), an MOSFET (FIG. 8D) or the like may constitute the impedance units Z71 and Z72.

Preferred Embodiment 8

FIG. 11A is a block diagram illustrating a constitution of a display device. A gate driver generates a gate signal and supplies the generated gate signal to N pieces of gate signal wires G_1-G_N. A data driver comprises k pieces of drive data voltage output circuits DRV_1-DRV_K, and supplies a drive data voltage to each of k pieces of data signal wires D_1-D_K. A display panel 100 comprises N×K pieces of pixel circuits PIX_11, PIX_12, . . . , PIX_1K, PIX_21, PIX_22, . . . , PIX_2K, . . . , PIX_N1, PIX_N2, . . . , PIX_NK. These pixel circuits are respectively controlled by each of the gate signal wires and data signal wires.

An example of the pixel circuit PIX is illustrated in FIG. 11B. ELO is a light emitting element, and its light emission is controlled by a current supplied from a transistor MDRV. A switch SWP2 is provided between the transistor MDRV and the light emitting element ELO, and controls the current supplied from the transistor MDRV to the light emitting element ELO. A capacitance CH is connected to between a gate of the transistor MDRV and a panel power supply VDDP, and retains a drive voltage of the MDRV. A switch SWP1 controls a connection between the data signal wire D and the gate of the transistor MDRV. Whether the switches SWP1 and SWP2 should be in the conducting or non-conducting state is controlled based on a gate signal G.

An operation of the pixel circuit PIX is briefly described. In the pixel circuit PIX, two operation time periods, which are a drive data voltage supply time period and a light emission time period, are set.

Drive Data Voltage Supply Time Period

During this time period, the switch SWP1 is let to the conducting state based on the gate signal wire G, while the switch SWP2 is led to the non-conducting state based on the gate signal wire G. Accordingly, the drive data voltage is supplied from the data signal wire D to the pixel circuit PIX. The drive data voltage charges a capacitance CH. At the time, there is no current flow in the light emitting element ELO which is disconnected from the transistor MDRV, and there is no light emission therefrom.

Light Emission Time Period

During this time period, the switch SWP1 is led to the non-conducting state based on the gate signal wire G, while the switch SWP2 is led to the conducting state based on the gate signal wire G. At the time, the capacitance CH retains the voltage charged during the drive data voltage supply time period, and applies the retained drive data voltage to the gate of the transistor MDRV. The transistor MDRV supplies a current responsive to the drive data voltage applied to the gate to the light emission element ELO via the switch SWP2. Accordingly, the light emission by the light emission element ELO is controlled depending on the current responsive to the drive data voltage.

FIG. 12 schematically show display states by the display device illustrated in FIG. 11. A single color is displayed on the entire screen as display data. FIG. 12A shows an ideal display state. Equal drive data voltages are supplied from drive data voltage output circuits DRV_i (i=1, 2, . . . , K) of a data driver to the respective pixel circuits via data wires D_i (i =1, 2, . . . K), and the data is shown with equal brightness levels.

FIG. 12B illustrates a display state where a single color is displayed on the entire screen in the case where variability exists among the drive data voltage output circuits. The pixel circuits connected to the same data signal wires D_1-D_K are driven by the same drive data voltage output circuits DRV_1-DRV_K. Therefore, the pixels, to which the drive data voltages having the same offset voltage are supplied, are aligned in a longitudinal direction of the screen. Consequently, such a longitudinal streak 110 that is illustrated in FIG. 12B appears on the screen.

In the display device constituted as described above, any of the constitutions according to the respective preferred embodiments of the present invention (offset cancellation circuits 1, 3, 5, 7, 8, 11 and 12) is incorporated in amplifying circuits in output stages of the k pieces of drive data voltage output circuits DRV_1-DRV_K provided in the data driver. Then, the variability of the drive data voltage due to the offset voltage among the drive data voltage output circuits can be controlled. As a result, display without streaks can be obtained as illustrated in FIG. 12A.

As described in the preferred embodiments, the non-overlap time period shown in FIG. 9 or 10 is included when the control signal SWA shifts to the control signal SWB or the control signal SWB shifts to the control signal SWA. This time period may equate to a time period necessary for the switches to be completely turned off (for example, approximately 50 ns).

In the preferred embodiments described so far, the active load is cascoded in order to shorten the charging time for the phase compensation capacitance and the charging time for the offset storage capacitance. However, it is needless to say that the differential pair may be cascoded.

In the preferred embodiments described so far, the description is given referring to MOS transistors; however, it is needless to say that bipolar transistors can configure a similar circuit.

The present invention is not necessarily limited to the preferred embodiments described so far, and can be modified without any limitation within the technical scope recited in the Scope of Claims.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. An offset cancellation circuit provided in an operational amplifier, configured such that a first active load is connected to a first differential pair, the first differential pair comprises a first inversion input unit and a first non-inversion input unit, the first active load comprises a first and second transistors, and the first and second transistors each comprise a gate, comprising:
   an input unit for inputting an input voltage to the first non-inversion input unit;
   a first capacitance connected to the gate of the first transistor;
   a second capacitance connected to the gate of the second transistor; and
   a switch for setting a first time period and a second time period in connection states between the first and second transistors and the first and second capacitances, wherein
   during the first time period, the connection states between the first and second transistors and the first and second capacitances are set so that a gate voltage of the first transistor is supplied to the first capacitance, and a gate voltage of the second transistor is supplied to the second capacitance,
   during the second time period, the connection states between the first and second transistors and the first and second capacitances are set, so that the first and second capacitances can retain charges, and the second time period is an output time period of the operational amplifier.

2. The offset cancellation circuit constituted as claimed in claim 1, further comprising:
   a first output unit from which an output of the operational amplifier is outputted;
   a third transistor combined with the first transistor, thereby constituting a first cascode circuit;
   a fourth transistor comprising a drain and a source, the fourth transistor combined with the second transistor, thereby constituting a second cascode circuit;
   a phase compensation capacitance provided between the source of the fourth transistor and the first output unit; and
   a second output unit connected to the drain of the fourth transistor, the second output unit outputting an output of the first differential pair and an output of the first active load.

3. The offset cancellation circuit constituted as claimed in claim 1, wherein
   the operation amplifier is configured as a voltage follower, and
   the offset cancellation circuit further comprises:
   a first output unit from which an output from the operational amplifier is outputted;
   a high-side transistor which is a drive transistor on the side of a high power supply of the first output unit; and
   a low-side transistor which is a drive transistor on the side of a low power supply of the first output unit, and
   during the first time period, the connection states between the first and second transistors, the first and second capacitances, the first output unit, the high-side transistor and the low-side transistor are set so that the input voltage is inputted to the input unit when the first inversion input unit, the first non-inversion input unit and the first output unit are connected to one another, and
   during the second time period, the connection states between the first and second transistors, the first and second capacitances, the first output unit, the high-side transistor and the low-side transistor are set so that the second time period becomes the output time period of the operational amplifier.

4. A display device comprising:
   a plurality of the offset cancellation circuits claimed in claim 1; and
   a liquid crystal cell in which a light transmission factor varies or an organic EL cell in which a brightness level of light emission varies, depending on an output voltage of the offset cancellation circuit.

* * * * *